(12) United States Patent
Hart et al.

(10) Patent No.: US 10,345,703 B2
(45) Date of Patent: Jul. 9, 2019

(54) SYSTEMS, DEVICES, AND METHODS FOR PRINTING ON THREE-DIMENSIONAL OBJECTS

(71) Applicants: MASSACHUSETTS INSTITUTE OF TECHNOLOGY, Cambridge, MA (US); The Regents of the University of Michigan, Ann Arbor, MI (US)

(72) Inventors: Anastasios John Hart, Waban, MA (US); Christopher Ryan Oliver, Commerce, MI (US); Adam Gregory Stevens, Midland, MI (US); Jieyuan Wu, Suzhou Industrial Park (CN); Chad Robert Archer, Midland, MI (US)

(73) Assignees: Massachusetts Institute of Technology, Cambridge, MA (US); The Regents of the University of Michigan, Ann Arbor, MI (US)

( * ) Notice: Subject to any disclaimer, the term of this patent is extended or adjusted under 35 U.S.C. 154(b) by 635 days.

(21) Appl. No.: 14/953,287

(22) Filed: Nov. 27, 2015

(65) Prior Publication Data
US 2016/0147153 A1    May 26, 2016

Related U.S. Application Data

(60) Provisional application No. 62/084,672, filed on Nov. 26, 2014.

(51) Int. Cl.
*G03F 7/20* (2006.01)
(52) U.S. Cl.
CPC ................. *G03F 7/2051* (2013.01)
(58) Field of Classification Search
None
See application file for complete search history.

(56) References Cited

U.S. PATENT DOCUMENTS

| 5,076,974 A | 12/1991 | Modrek et al. |
| 5,178,974 A | 1/1993 | Hawryluk et al. |

(Continued)

FOREIGN PATENT DOCUMENTS

WO    97/45782 A2    12/1997

OTHER PUBLICATIONS

Auyeung, R.C.Y., et al., "Laser forward transfer based on a spatial light modulator," Appl. Physics A, 2011, v. 102, pp. 21-26.

(Continued)

*Primary Examiner* — Shamim Ahmed
*Assistant Examiner* — Bradford M Gates
(74) *Attorney, Agent, or Firm* — Nutter McClennen & Fish LLP

(57) ABSTRACT

Systems, devices, and methods for printing on surfaces of three-dimensional objects are provided. The systems, devices, and methods allow for images, and three-dimensional structures, to be printed onto a surface of a three-dimensional object. The surface of the three-dimensional object can have many different shapes, including an arbitrary or non-uniform shape having multiple curves. In one exemplary embodiment, the method includes associating a pattern of polygons with a surface of a three-dimensional object and then scaling a pattern of polygons associated with an image to be printed onto the surface with the pattern of polygons associated with the surface. One or more polygons of the scaled pattern of polygons are then progressively projected onto the surface, and a photosensitive material associated with the surface is cured to set projected image portion on the surface. Systems, devices, and other methods for printing onto surfaces of three-dimensional objects are also provided.

30 Claims, 15 Drawing Sheets

(56) References Cited

U.S. PATENT DOCUMENTS

| | | | |
|---|---|---|---|
| 6,304,316 | B1 | 10/2001 | Jain et al. |
| 6,379,867 | B1 | 4/2002 | Mei et al. |
| 6,391,245 | B1 | 5/2002 | Smith |
| 6,416,908 | B1 | 7/2002 | Klosner et al. |
| 6,707,534 | B2 | 3/2004 | Bjorklund et al. |
| 7,106,415 | B2 | 9/2006 | Kuchibhotla et al. |
| 7,110,082 | B2 | 9/2006 | Smirnov et al. |
| 7,790,333 | B2 | 9/2010 | Guibert |
| 8,017,308 | B2 | 9/2011 | Hogue et al. |
| 2005/0058332 | A1* | 3/2005 | Kaufman ............... G03B 21/00 382/133 |
| 2008/0174758 | A1 | 7/2008 | Gellrich et al. |
| 2010/0002402 | A1 | 1/2010 | Rogers et al. |
| 2014/0065294 | A1 | 3/2014 | Ramanujan et al. |

OTHER PUBLICATIONS

International Search Report and Written Opinion, dated Mar. 30, 2016, for Application No. PCT/US2015/062840 (16 pages).

[No Author Listed] Spherical surface lithography solutions. Aiscent Technologies Advanced Laser Dynamic Imaging, 2012, 3 pages. Includes product datasheet. Retrieved from <www.aiscenttech.com/en/solutions/sphericallithography/>.

Callow, J.A., et al., Trends in the development of environmentally friendly fouling-resistant marine coatings. Nat Commun. 2011;2:244. doi: 10.1038/ncomms1251.

Castro, N.J., et al., Recent progress in interfacial tissue engineering approaches for osteochondral defects. Ann Biomed Eng. Aug. 2012;40(8):1628-40. doi: 10.1007/s10439-012-0605-5. Epub Jun. 8, 2012.

Chung, H.J., et al., Stretchable, multiplexed pH sensors with demonstrations on rabbit and human hearts undergoing ischemia. Adv Healthc Mater. Jan. 2014;3(1):59-68. doi: 10.1002/adhm. 201300124. Epub Jul. 19, 2013.

Cohen, D.L., et al., Additive manufacturing for in situ repair of osteochondral defects. Biofabrication. Sep. 2010;2(3):035004. doi: 10.1088/1758-5082/2/3/035004. Epub Sep. 8, 2010.

Cui, X., et al., Direct human cartilage repair using three-dimensional bioprinting technology. Tissue Eng Part A. Jun. 2012;18(11-12):1304-12. doi: 10.1089/ten.TEA.2011.0543. Epub Apr. 19, 2012.

Genzer, J., et al., Recent developments in superhydrophobic surfaces and their relevance to marine fouling: a review. Biofouling. 2006;22(5-6):339-60.

Han, M., et al., 3D microfabrication with inclined/rotated UV lithography. Sensors and Actuators A: Physical. vol. 111, Issue 1, Mar. 1, 2004, pp. 14-20.

International Invitation to Pay Additional Fees for International Application No. PCT/US15/62840, dated Jan. 28, 2016 (2 pages).

Kim, et al., In vivo biodegradation and biocompatibility of PEG/sebacic acid-based hydrogels using a cage implant system. J Biomed Mater Res A. Oct. 2010;95(1):191-7. doi: 10.1002/jbm.a.32810.

Kong, Y.L., et al., 3D printed quantum dot light-emitting diodes. Nano Lett. Dec. 10, 2014;14(12):7017-23. doi: 10.1021/nl5033292. Epub Nov. 6, 2014.

Lafratta, C.N., et al., Multiphoton fabrication. Angew Chem Int Ed Engl. 2007;46(33):6238-58.

Liddle, J.A., et al., Lithography, metrology and nanomanufacturing. Nanoscale. Jul. 2011;3(7):2679-88. doi: 10.1039/c1nr10046g. Epub Apr. 12, 2011.

Love, J.C., et al., Microscope projection photolithography for rapid prototyping of masters with micron-scale features for use in soft lithography. Langmuir. 2001:17(19);6005-12.

Murat, H., et al., Two LCOS full color projector with efficient LED illumination engine. Displays. vol. 30, Issues 4-5, Dec. 2009, pp. 155-163.

Murphy, C.J., et al., Anisotropic metal nanoparticles: Synthesis, assembly, and optical applications. J Phys Chem B. Jul. 28, 2005;109(29):13857-70.

Pique, A., et al., eds., Direct-write Technologies for Rapid Prototyping Applications: Sensors, Electronics, and Integrated Power Sources. Academic Press, 2002. Table of contents only, 17 pages.

Rabinovitz, Y.K., Digital Light Processing Technology (DLP) Beyond any conventional projection. Opli. Courtesy of EKB Technologies Ltd Israel. 2014, 7 pages. Retrieved from <http://www.opli.net/magazine/eo/2011/news/dlp_tech.aspx>.

Schmid, G.M., et al., Step and flash imprint lithography for manufacturing patterned media. J Vac Sci Technol B. Mar./Apr. 2009;27(2):573-580.

Schmid, H., et al., Light-coupling masks: An alternative, lensless approach to high-resolution optical contact lithography. J Vac Sci Technol B. Nov./Dec. 1998;16(6):3422-3425.

Spring, K.R., et al., Depth of Field and Depth of Focus. Nikon. MicroscopyU: The Source for Microscopy Education. Publication Date Unknown. 3 pages. Retrieved from <http://www.microscopyu.com/print/articles/formulas/formulasfielddepth-print.html>, accessed on Aug. 14, 2015.

Van Kessel, P.F., et al., A MEMS-based projection display. Proceedings of the IEEE, vol. 86, Issue 8, Aug. 1998, pp. 1687-1704.

* cited by examiner

SYSTEMS, DEVICES, AND METHODS FOR PRINTING ON THREE-DIMENSIONAL OBJECTS

CROSS REFERENCE TO RELATED APPLICATION

The present disclosure claims priority to U.S. Provisional Application No. 62/084,672, entitled "Patterning of Arbitrary 3D Surfaces via Direct-Write Hybrid Lithography," which was filed on Nov. 26, 2014, and which is incorporated by reference herein in its entirety.

GOVERNMENT RIGHTS

This invention was made with Government support under Grant No. DMR-1120187 awarded by the National Science Foundation. The Government has certain rights in the invention.

FIELD

The present disclosure relates to systems, devices, and methods for printing on surfaces of three-dimensional objects where the surface has non-planar curvature, and more particularly relates using direct-write hybrid lithography to print on the surfaces of three-dimensional objects.

BACKGROUND

Printing in two-dimensions and in three-dimensions has evolved tremendously in the past thirty years or so. Three-dimensional printers in particular recently have seen a dramatic increase in usage and a dramatic decrease in prices related to printing, thus allowing the printing of three-dimensional objects to be a more available form of printing for the general public. While a person can more easily print three-dimensional objects, the ability to print onto the surface of an already existing three-dimensional object continues to be a form of printing that has not improved nearly as dramatically. This is particularly the case when trying to print an image onto a large surface of a three-dimensional object.

The limitations of existing techniques for printing onto surfaces of three-dimensional objects are many. Besides it being difficult to print onto objects having any significant size, existing systems, devices, and methods are slow, inefficient, and impractical for daily use. Further, even when using existing slow, inefficient printing systems, they are limited in the types of surfaces onto which they can print. Many systems are limited to only printing on surfaces like a sphere, and not on surfaces that have multiple radii of curvature and/or surfaces having arbitrary curves across a surface area with any quality and speed. To the extent any of the existing techniques involve projecting an image onto a surface of a three-dimensional object, the focus of the image for an area of a surface of any significance is typically poor. Despite the versatility and scalability of modern photolithography, these techniques typically require a fixed mask, which makes the cost high for producing new patterns and cannot be adapted to change shape and size based on the local pattern desired in three-dimensional lithography. Still further, the types of surfaces of a three-dimensional object onto which can be printed using existing systems, devices, and methods are limited.

Accordingly, it is desirable for systems, devices, and methods for printing on surfaces of three-dimensional objects be faster, cover large areas, be of a much higher quality, and allow for the ability to print on surfaces having multiple radii of curvature (i.e., surfaces that include a non-planar curvature), including surfaces having arbitrary or non-uniform curves across a surface area, with speed and precision. It is also desirable for such systems, devices, and methods allow for the printing on surfaces of three-dimensional objects made of a wide variety of materials.

SUMMARY

Systems, devices, and methods are generally provided for printing on surfaces of three-dimensional objects. The techniques described utilize a direct-write hybrid lithography approach, relying on associating patterns of polygons with both an image to be printed and a surface onto which the image is to be printed. The two sets of polygon patterns are then compiled and scaled appropriately to assign a texture, region, or portion of the image to be printed with each individual polygon such that a totality of the polygons forms the entire image. A progressive printing process is used to project smaller portions of the image, e.g., one or more polygons but not all of the polygons, onto a surface that has photosensitive properties associated with it. As each polygon is projected onto the surface, the texture or region associated with that polygon can be cured to set that portion of the image with respect to the surface. To insure that the projected and subsequently printed polygons are properly focused, a feedback component can be used to duplicate the image being projected onto the surface. The duplicate image can be used to evaluate the focus of the projected image so that appropriate adjustments to the focus can be made if desired.

The surfaces on which the images are printed can have a non-planar curvature, and in fact the surfaces can have multiple radii of curvature. Further, the surfaces on which the images are printed can be surfaces that are larger than is generally effectively possible using existing systems, devices, and methods. Accordingly, there are a wide variety of objects on which the disclosed techniques can be performed and with which the disclosed systems and devices can be used to print on the objects. By way of non-limiting examples, some of the three-dimensional objects having surfaces onto which can be printed in accordance with the present disclosures include biomedical devices, body armor, helmets, medical implants including for the eyes, for hearts, and for bones, skin, nanostructures such as carbon nanotubes, circuit boards, tissues, including cartilage and retinas, prosthetics, and large plastic parts, among others. Further, in view of the present disclosures, systems, devices, and methods for printing three-dimensional objects is also possible.

In one exemplary embodiment of a system for printing onto a surface of a three-dimensional object, the system includes a light source, a controller, an objective or lens, and a spatial light modulator. The controller can be configured to formulate an image to be projected onto a surface of a three-dimensional object, with the image having a pattern of polygons associated with it such that each polygon is associated with a region of the image (i.e., each polygon defines a portion of the image). The objective directs light received from the spatial light modulator towards the surface of the three-dimensional object onto which the image is to be projected. The spatial light modulator is configured to direct light received from the light source towards the objective based on the formulated image generated by the controller. The image is thus projected onto the surface of the three-dimensional object. The controller is configured to command the spatial light modulator to progressively project one subset of the pattern of polygons at a time until each polygon of the pattern of polygons is projected onto the surface. The controller is also configured to command the system to progressively cure the photosensitive material disposed on the surface of the three-dimensional object at a location at which each subset of the pattern of polygons is projected onto the surface. A subset of the pattern of polygons includes one or more polygons, but not every polygon, of the pattern of polygons.

In some exemplary embodiments, the objective is movable such that it has six degrees of freedom. It can also be coupled to the spatial light modulator. In such embodiments, a robotic manipulator can have the spatial light modulator, and thus the objective, attached to it as an end effector, and the robotic manipulator can be movable across six degrees of freedom to provide the six degrees of freedom to the objective. The system can also include a kinematic mount and a rotary stage, which can provide a seventh degree of freedom to the system. More specifically, the kinematic mount can be coupled to a top surface of the rotary stage and can be configured to receive a three-dimensional object onto which the projected image is to be printed. The rotary stage can then be configured to move the a three-dimensional object that is coupled to the kinematic mount with respect to the objective, thus providing a seventh degree of freedom related to the objective. In some embodiments, the controller can be configured to operate a driver associated with each of the robotic manipulator and the rotary stage, in conjunction with commanding each of the spatial light modulator and a portion of the system associated with curing photosensitive material, to sync positioning the three-dimensional object onto which the projected image is to be printed with respect to the objective with the progressive projection performed by the spatial light modulator and the progressive curing performed by the system.

The controller can formulate an image to be printed onto a surface of a three-dimensional object by scaling a pattern of polygons associated with an image to be projected onto a surface of a three-dimensional object with a pattern of polygons associated with the surface of the three-dimensional object. The controller can record information about a relationship between the pattern of polygons associated with an image to be projected onto a surface of a three-dimensional object and a pattern of polygons associated with the surface of the three-dimensional object in an .OBJ file format. In some embodiments, the controller can command the spatial light modulator to progressively project one subset of the pattern of polygons at a time by identifying a centroid of each subset and adjusting a location of the objective with respect to the surface of the three-dimensional object onto which the projected image is to be printed such that a plane of the objective that is approximately normal to a central axis of the objective is approximately normal to the centroid, and such that a distance between a distal end of the objective and the surface of the three-dimensional object results in the projected image being focused.

The controller can also be configured to determine an area of the surface of the three-dimensional object onto which one subset of the pattern of polygons is to be printed while still providing a focused image. In other words, the controller can be programmed to determine the proper size of the subset of polygons vis-à-vis the surface area of the surface for purposes of determining how much surface area each subset should cover. As a result, the controller determines the number of subsets and/or polygons that are needed to project and print the entire image. The controller determination can be based on a local radius of curvature of the three-dimensional object and a depth of field associated with the spatial light modulator.

The spatial light modulator can include a number of different mechanisms configured to receive and distribute light. Some non-limiting examples of these types of mechanisms include a digital light processing (DLP) device, a digital micromirror device (DMD) having a plurality of mirrors that are individually controllable to selectively reflect light toward the surface of the three-dimensional object, a liquid crystal on silicon (LCOS) chip, a laser-producing device, and an electron-beam producing device. Each such device can direct the light received from the light source towards the objective.

The light source can be configured to both direct light towards the spatial light modulator and to cure a photosensitive material disposed on the surface of the three-dimensional object to cause the projected image to be printed onto the surface of the three-dimensional object. In some embodiments, the light source can be two separate light sources, with a first light source being configured to direct light towards the spatial light modulator and the second light source being configured to cure a photosensitive material disposed on the surface of the three-dimensional object to cause the projected image to be printed onto the surface of the three-dimensional object.

The system can also include a feedback component. The feedback component can be disposed between the spatial light modulator and the objective, and it can include a beamsplitter and a beam analyzer. The beamsplitter can be configured to split light that is directed from the spatial light modulator, towards the objective, into at least two beams. The first beam can continue to be directed towards the objective, while the second beam can be directed to the beam analyzer. The beam analyzer can be configured to receive the second beam, which includes the same portion of the image that is projected onto the surface of the three-dimensional object by the first beam. In some embodiments, the beam analyzer includes a camera sensor to receive the portion of the image associated with the second beam, and a charge-coupled device that is configured to communicate the received image portion to an external display. The external display then shows the portion of the image being transmitted by each of the first and second beams, and a user can adjust parameters of the system to achieve a focused image. In alternative embodiments, the charge-coupled device can be configured to communicate the received image portion to an auto-focusing device, which can automatically adjust parameters of the system to achieve a focused image. Whether controlled by a user's observations of the image associated with the external display, or by an auto-focusing device, the controller can be configure to adjust the focus of the image that is projected onto the surface of the three-dimensional object by the first beam based on feedback related to the received image communicated by the charge-coupled device. Further, the beam analyzer can be configured to move relative to the beamsplitter to adjust the focus of the received image.

The polygons that are associated with the image and the surface of the three-dimensional object can be any type of polygon, and in some exemplary embodiments, the polygons are triangles. Further, the surface of the three-dimensional object onto which the image is to be projected can include many different shapes and configurations, including three-dimensional shapes that are arbitrary. In some embodiments, the surface can include multiple curved surfaces, with the curved surfaces having different radii of curvature.

In one exemplary embodiment of a method of printing onto a surface of a three-dimensional object, the method includes conducting a three-dimensional scan of a surface of a three-dimensional object and associating a pattern of polygons with the surface. Information about a relationship between the pattern of polygons and the scanned surface is recorded, as is information about a relationship between a pattern of polygons associated with an image to be projected onto the surface. The pattern of polygons associated with the image is scaled to the pattern of polygons associated with the surface based on the recorded information to create a scaled pattern of polygons. A photosensitive material is deposited onto the surface of the three-dimensional object, and one or more polygons of the scaled pattern of polygons is projected onto the surface. The photosensitive material deposited on a portion of the surface onto which the one or more polygons of the scaled pattern of polygons are projected is then cured. The steps of projecting and curing can then be progressively repeated using one or more polygons of the scaled pattern of polygons until each polygon has been projected and cured, and thus the entire image has been projected and printed onto the surface of the three-dimensional object.

The step of recording information about a relationship between the pattern of polygons and the scanned surface can include recording information about locations of polygons of the pattern of polygons on the scanned surface, and likewise, the step of recording information about a relationship between a pattern of polygons associated with an image to be projected onto the surface can include recording information about a region of the image located within each polygon of the pattern of polygons. As a result, the step of scaling the pattern of polygons associated with the image to the pattern of polygons associated with the surface can include associating the information about the region of the image located within each polygon of the pattern of polygons with the respective polygons of the pattern of polygons on the scanned surface of the three-dimensional object.

In some embodiments, the step of projecting one or more polygons of the scaled pattern of polygons onto the surface can include identifying a centroid of each one or more polygons of the scaled pattern of polygons to be projected onto the surface and moving at least one of the three-dimensional object and a printing device that projects the one or more polygons of the scaled pattern of polygons onto the surface such that the printing device is approximately normal to the centroid. The movement can also make it such that a distance between the printing device and the surface of the three-dimensional object provides a focused image for the one or more polygons that are projected. In embodiments in which the three-dimensional object is temporarily mounted onto a movable stage, the stage can be moved to position the centroid such that a plane of the printing device that is approximately normal to a central axis of the printing device is approximately normal to the centroid and the distance between the printing device and the surface of the three-dimensional object provides a focused image for the one or more polygons that are projected.

One or more additional polygons of the scaled pattern of polygons can be projected onto the surface of the three-dimensional object, and the photosensitive material deposited on another portion of the surface onto which the one or more additional polygons of the scaled pattern of polygons are projected can be cured. The additional polygons of the scaled pattern of polygons can be progressively projected onto the surface, and the photosensitive material deposited on each respective portion of the surface can be cured to print the image onto the surface. In some embodiments, the surface can be coated with a material that sets the cured printed image on the surface.

Light can be used to project one or more polygons of the scaled pattern of polygons onto the surface of the three-dimensional object. In some such embodiments, a beam of light that is directed towards the surface of the three-dimensional object can be split such that a portion of the beam is directed towards the surface and a portion of the beam is directed towards an alternate location. An image associated with the beam that is directed towards the alternate location can be reviewed, and adjustments to the system can be made to provide a more focused image. For example, a location of at least one of the three-dimensional object and a printing device that projects the one or more polygons of the called pattern of polygons onto the surface of the three-dimensional object can be adjusted based on the review. In some instances, the adjustments can be automated, which is to say that a system automatically recognizes that the image is not properly focused and it self-adjusts to provide a properly focused image. In other instances, one or more images from one or more cameras that are directed towards the three-dimensional object can be involved in determining if adjustments are to be made. More specifically, adjustments to locations of either or both of the three-dimensional object and a printing device that projects the one or more polygons of the scaled pattern of polygons onto the surface of the three-dimensional object can be based on a review of the one or more images that are received from the camera(s) directed towards the three-dimensional object.

In some embodiments, an area of the surface of the three-dimensional object onto which to project the one or more polygons of the scaled pattern of polygons can be determined. The determination can be made in a manner that results in a focused image being maintained. One way the determination can be made is basing it on a local radius of curvature of the three-dimensional object onto which the image is to be printed and a depth of field associated with a device that projects the one or more polygons of the scaled pattern of polygons onto the surface of the three-dimensional object. Further, when recording information about a relationship between the pattern of polygons and the scanned surface, the information can be recording in an .OBJ file format.

The polygons of each of the pattern of polygons associated with the surface, the pattern of polygons associated with the image, the scaled pattern of polygons, and the one or more polygons of the scaled pattern of polygons that are projected onto the surface can be any type of polygon, and in some exemplary embodiments, the polygons are triangles. A ratio of polygons associated with the surface to an area of the surface can be approximately equal to or greater than about 100 polygons per square millimeter. Further, the surface of the three-dimensional object onto which the image is to be projected can include many different shapes and configurations, including three-dimensional shapes that are arbitrary. In some embodiments, the surface can include multiple curved surfaces, with the curved surfaces having different radii of curvature.

BRIEF DESCRIPTION OF DRAWINGS

This disclosure will be more fully understood from the following detailed description taken in conjunction with the accompanying drawings, in which.

DETAILED DESCRIPTION

Certain exemplary embodiments will now be described to provide an overall understanding of the principles of the structure, function, manufacture, and use of the devices and methods disclosed herein. One or more examples of these embodiments are illustrated in the accompanying drawings. Those skilled in the art will understand that the devices and methods specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention.

The present disclosure generally relates to systems, devices, and methods for printing on surfaces of three-dimensional objects where the surface has a non-planar curvature. It provides for the use of direct-write hybrid lithography techniques to print both two-dimensionally and three-dimensionally onto a surface of a three-dimensional object. Notably, for purposes of the present disclosure, a piece of paper is not generally considered to be a three-dimensional object having a surface with non-planar curvature. The surface of a three-dimensional object onto which an image (or structure in the case of three-dimensional printing) is printed can be larger in scale in comparison to surfaces of three-dimensional objects onto which can be printed using traditional techniques, systems, and devices. Further, the shape or configuration of the surface of a three-dimensional object onto which an image (or structure in the case of three-dimensional printing) is printed can be asymmetrical, non-uniform, or otherwise arbitrary such that the surface includes multiple curves and multiple radii of curvature. Traditional techniques, systems, and devices are typically limited to printing on an object such as a small sphere. While the present disclosure is directed to printing on surfaces of three-dimensional objects, the systems, devices, and methods provided for herein can be used, or can be adapted for use, in conjunction with two-dimensional printing if desired.

Figure 1:
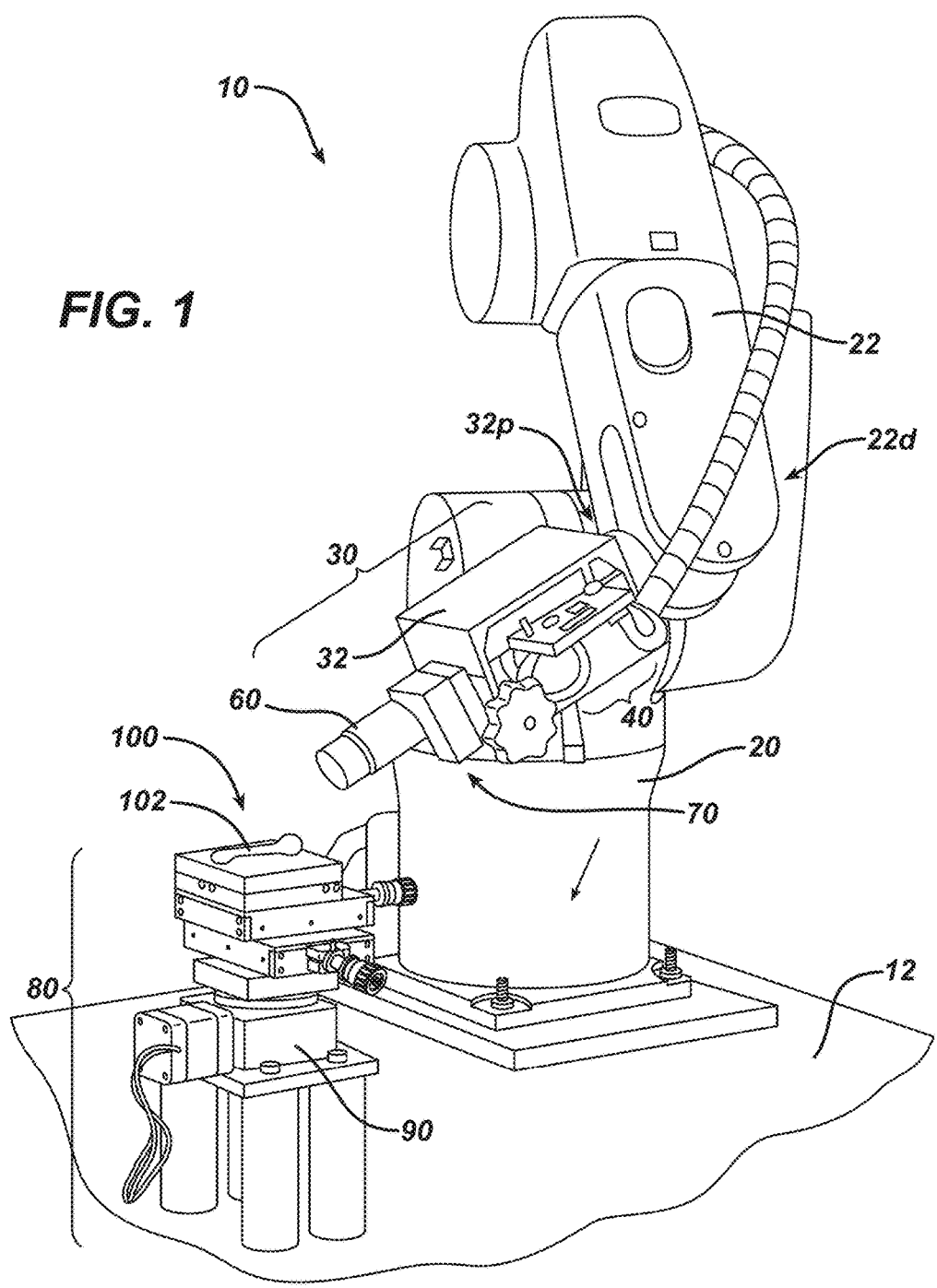
FIG. 1 is a perspective view of one exemplary embodiment of a system for printing onto a three-dimensional object, the system including a robotic manipulator, an end effector assembly, and an object-holding platform.
Figure 2A:
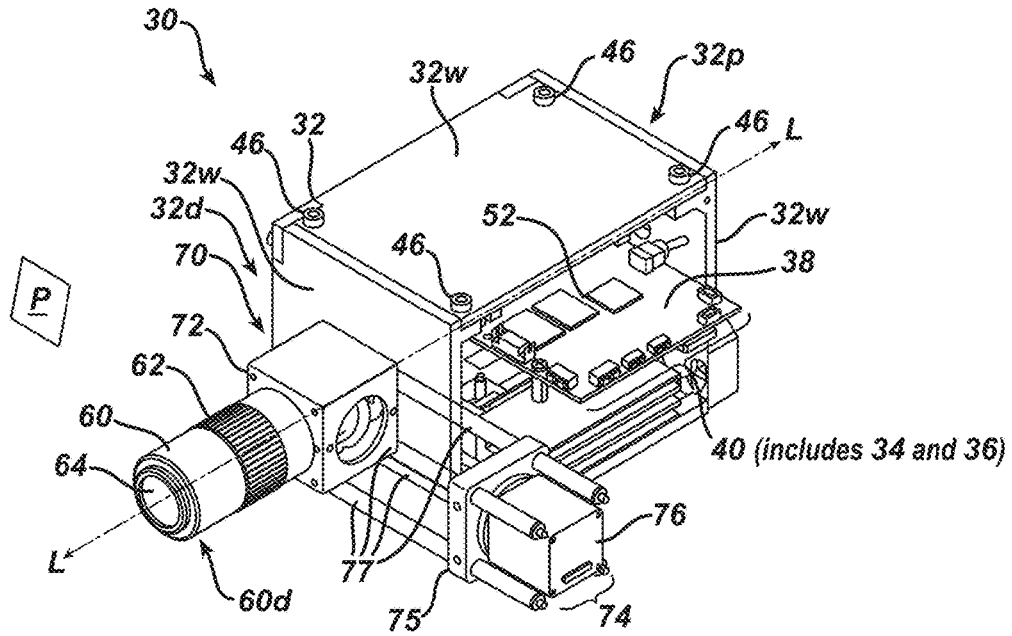
FIG. 2A is an isometric view of the end effector assembly of FIG. 1.
Figure 2B:
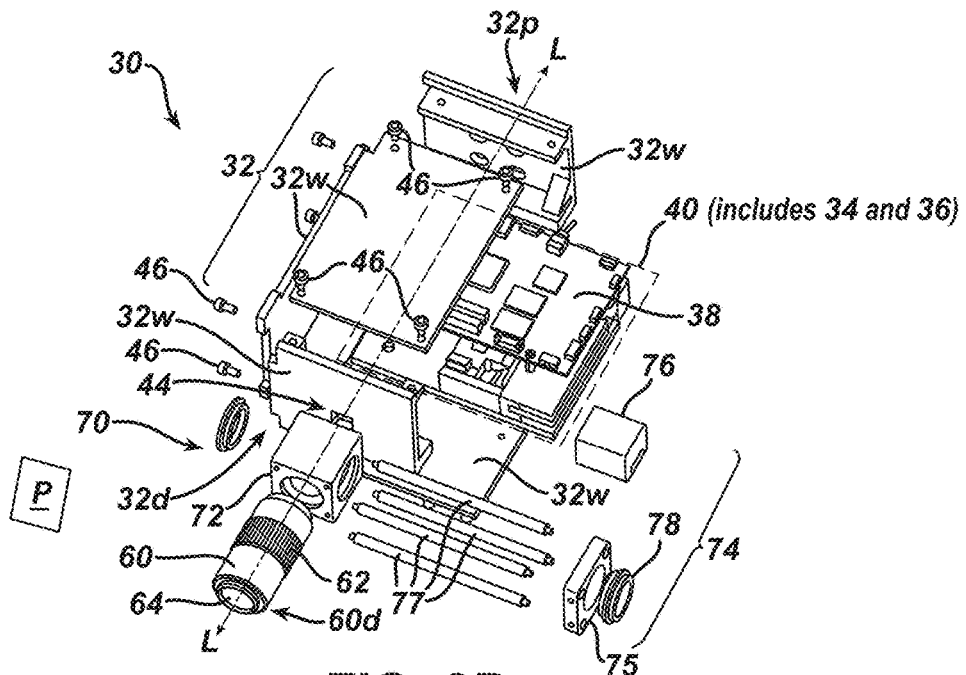
FIG. 2B is an isometric, exploded view of the end effector assembly of FIG. 2A.
Figure 2C:
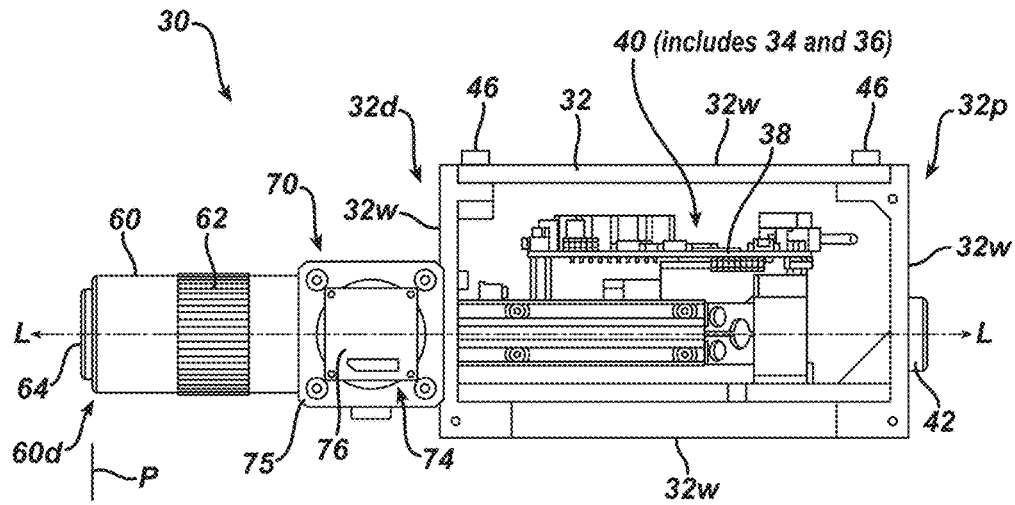
FIG. 2C is a side view of the end effector assembly of FIG. 2A.
Figure 2D:
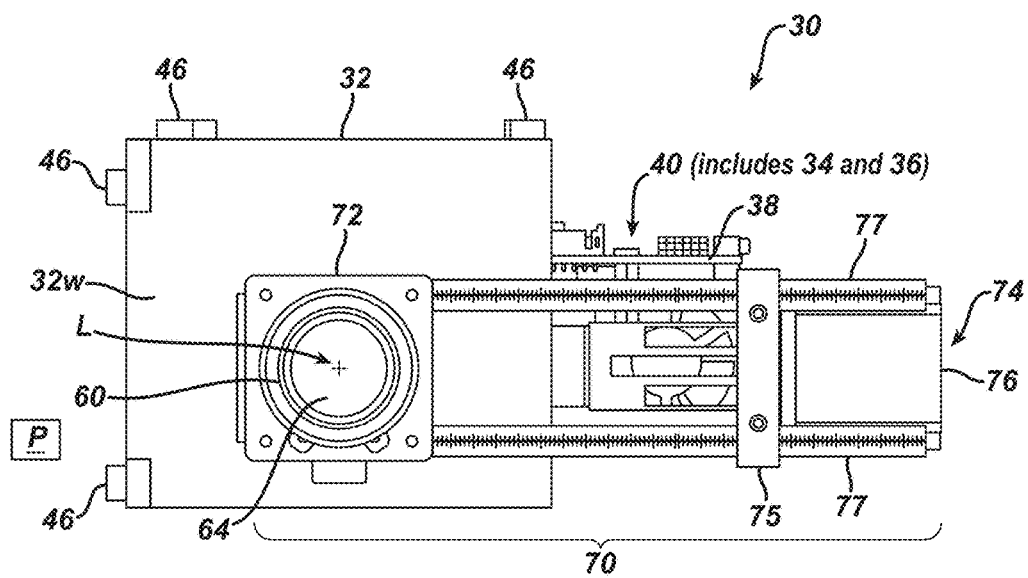
FIG. 2D is a front view of the end effector assembly of FIG. 2A.

In one exemplary embodiment of a system 10 for printing on a surface of a three-dimensional object, the system 10 includes a robotic manipulator 20 having an end effector 30 associated with it that projects an image to be printed onto a surface of a three-dimensional object and subsequently prints that image by activating a photoresistive (photosensitive) or light-sensitive material disposed on the surface of the three-dimensional object. As shown, an object 100 can be mounted on an object-holding platform 80 that includes a rotary stage 90, and the end effector 30 can be maneuvered by the robotic manipulator 20 across six degrees of freedom to project and print an image on a surface 102 of the object 100. The stage 90 can also be maneuvered to adjust a location of the object 100 with respect to the end effector 30, thus providing a seventh degree of freedom for the system. Each of the end effector 30 (FIGS. 2A-4), the robotic manipulator 20 (FIG. 1), and the object-holding platform 80 (FIGS. 5A-8D) are described with more particularly below, as are the techniques used in conjunction with performing the projecting and printing onto the surface 102 (FIGS. 9A-13F).

The end effector 30 is illustrated in FIGS. 2A-2D. Generally, the end effector 30 can include components used to: (1) formulate the parameters needed to perform projecting and printing an image onto a surface of a three-dimensional object; (2) project the image to be printed onto the surface; and (3) cure or otherwise print the image onto the surface. The end effector 30 can also include a feedback component or mechanism designed to duplicate the projected image to a second location for use in analyzing the quality of the image, for instance that it is of an appropriate size in relation to the surface onto which it is printed and it is properly focused. Users, or the system itself, can then make adjustments to insure that the image is properly formed on the surface before curing the photoresistive or light-sensitive material disposed on the surface. Other functions can also be performed by the end effector, and/or components thereof, including those described in the present disclosure.

The end effector 30 includes a housing 32 having disposed therein a spatial light modulator 40 that includes each of a first light source 34 (not explicitly illustrated in the figures, but a person skilled in the art will recognize where it would be disposed based on the present disclosures and knowledge of exemplary spatial light modulators), a second light source 36 (also not explicitly illustrated in the figures, but a person skilled in the art will recognize where it would be disposed based on the present disclosures and knowledge of exemplary spatial light modulators), and a controller 38. In other embodiments, one or more of these components can be separately disposed. The housing 32 can have any shape, size, and overall configuration based, at least in part, on the components disposed therein and the other aspects of the system with which it is used. In the illustrated embodiment, the housing 32 has a generally rectangular shape and includes a proximal or back end 32p having one or more alignment pins 42 (FIG. 2C) formed therein to mount with complementary mounting features associated with the robotic manipulator 20. Of course, other known techniques for mounting one component to another can also be used to mount the end effector 30 to the robotic manipulator 20.

The housing 32 also includes an opening 44 (FIG. 2B) formed in its distal or front end 32d, through which light can be directed, as described below. As shown, walls 32w of the housing can be attached together using fasteners 46, or using other techniques for coupling two components together known to those skilled in the art. Although in the illustrated embodiment one of the sides of the housing 32 is illustrated as being open, and thus does not include a wall, a person skilled in the art will recognize that the housing 32 can be fully closed so that the components disposed therein are protected from an outside environment.

The first light source 34 (as indicated above, this component is not explicitly illustrated in the figures) can be disposed within the housing 32 and can be used to direct a beam of light toward the spatial light modulator 40. In conjunction with the embodiment illustrated, the first light source 34 is part of the spatial light modulator 40. Many different types of light sources can be used to provide incidence light to the system 10 without departing from the spirit of the present disclosure. For example, the first light source 34 can be a light-emitting diode (LED) that includes red and blue visible wavelengths of about 275 lux and about 100 lux, respectively.

The spatial light modulator 40 can be a component that is configured to direct light received from the first light source 34 towards the opening 44, and thus to an objective or lens 60. As shown, light passing through the opening 44 is also directed to a feedback assembly 70, although such an assembly does not have to be part of the end effector 30, or part of the system 10 more generally. Further details about the objective 60 and the feedback assembly 70 are provided below.

The spatial light modulator 40 can have a variety of configurations, some of which can be used for masked lithography, while others can be used for maskless lithography. A person skilled in the art will recognize that masked lithography typically require a surface of the three-dimensional object onto which is being printed be made of certain materials, such as polymers, glass, or glass-type materials, including chrome and quartz. Accordingly, when the spatial light modulator is configured for use with maskless lithography, it typically provides more versatility in terms of the types of materials onto which it can print. Some exemplary maskless lithography components that can be used as, or in conjunction with, the spatial light modulator 40 include a digital light processing (DLP) device, a digital micromirror device (DMD), a liquid crystal on silicon chip (LCOS), a laser, and an electron-beam. The maskless lithography components can be configured to selectively direct light received from the first light source 34 either towards the opening 44 or away from the opening 44, such as to a heat sink 48 associated with the spatial light modulator 40 (similar to the light sources 34 and 36, the heat sink 48 is not explicitly illustrated in the figures, but a person skilled in the art will recognize where it would be disposed based on the present disclosures and knowledge of exemplary spatial light modulators). A heat sink 48 can be disposed elsewhere in the housing 32 as well. The maskless lithography components can also be used for curing.

Figure 3A:
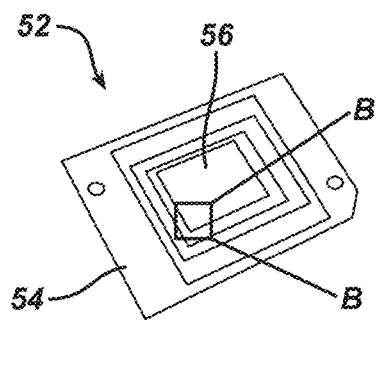
FIG. 3A is a perspective view of one exemplary embodiment of a digital micromirror device for use in conjunction with an end effector assembly like the end effector assembly of FIG. 2A.
Figure 3B:
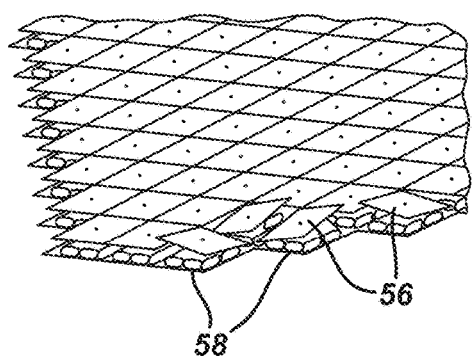
FIG. 3B is a perspective, detailed view of a portion of a mirror array of the digital micromirror device of FIG. 3A, the portion being identified by the box labeled B-B in FIG. 3A.

While many different masked and maskless lithography components can be used as, or in conjunction with, the digital spatial light modulator 40, a DMD 52 that can be used as the spatial light modulator is illustrated in FIGS. 3A and 3B. As shown, the DMD 52 can include a base 54 on which a plurality of mirrors 56 (upwards of several hundred thousand microscopic mirrors) can be disposed in an array. Each mirror 56 can be associated with its own actuation component, as shown a yoke 58 (FIG. 3B) connected to two support posts by compliant torsion hinges, thus enabling each mirror 56 to rotate approximately ±10 degrees to approximately ±12 degrees between on and off states based on whether or not a voltage is supplied to each mirror. Each mirror 56 can be mapped to a corresponding pixel of an image to be displayed, and they can be rotated between the on and off states so that pixel is either on, meaning light is reflected off the mirror to the image, or off, meaning light is reflected off the mirror to another location, such as the heat sink 48, and thus that pixel in the image appears dark.

Figure 3C:
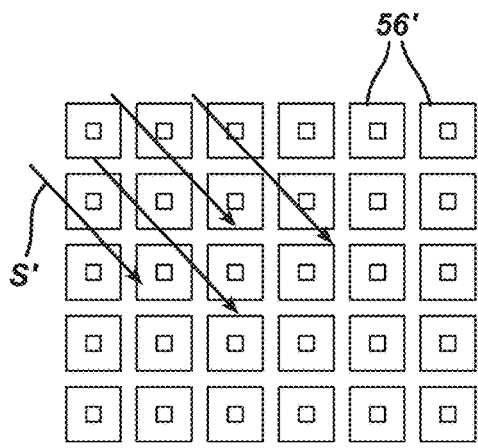
FIG. 3C is a schematic view of one exemplary arrangement of a mirror array for use in a digital micromirror device.
Figure 3D:
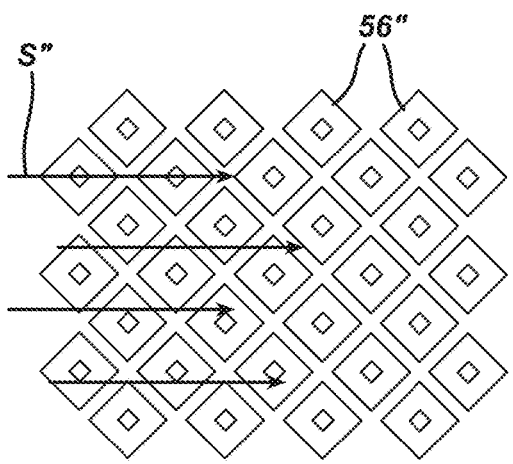
FIG. 3D is a schematic view of another exemplary embodiment of a mirror array for use in a digital micromirror device.

The mirrors 56 can be arranged in a variety of manners to form different arrays. The array of mirrors 56 in FIG. 3B, as well as the array of mirrors 56" in FIG. 3D, form a diamond mirror pattern, the array of mirrors 56' in FIG. 3C forms a checkerboard mirror pattern. As shown in FIGS. 3C and 3D by arrows S' and S", respectively, incident illumination of light coming from the first light source 34 and reflected off the mirrors 56', 56" changes based on the mirror pattern. Generally, diamond mirror patterns simplify the design of the system, but require interpolation because the pixels are not oriented with image pixels from a screen. The system 10 uses the DMD 52, and thus the angle of incidence is accounted for in the design of the housing 32. A person skilled in the art, in view of the present disclosures, would understand how to modify the housing 32 for use with a checkerboard mirror pattern, as well as for other maskless and masked lithography components.

In one exemplary embodiment, the digital spatial light modulator 40 is the DLP® LightCrafter™ 4500 development module distributed by Texas Instruments Inc. of Dallas, Tex., which has an HDMI-based communication method and can stream video at 60 frames per second, and has a resolution of 912×1140 pixels with a pitch of 7.6 micrometers. A cover glass on the DMD 52 can act as a bandpass filter between wavelengths of about 405 nanometers and about 750 nanometers. Further, the controller of the system is configured for development and experimentation with a built in illumination via a blue, red, and green LED, i.e., the first and second light sources 34 and 36. The settings of the DLP® LightCrafter™ 4500 development module can be configured by a USB connection to a personal computer and controlled by either the manufacturer software or with a custom C++ interface for both the image projected and the LED voltage, i.e., the controller 38.

Turning back to FIGS. 2A-2D, a controller 38 is included within the housing 32 of the end effector 30. The controller 38 can be used to operate the processes described in greater detail below, but generally it is used to formulate the relationship between an image to be printed on the surface and the surface itself. Both the image and the surface have a plurality of polygons (e.g., triangles) associated with them, and the controller 38 processes these two groups of polygons to formulate an image to be projected onto the surface that itself is divided into polygons. The controller 38 then commands the progressive projection and subsequent curing of a subset of the polygons onto the surface. The subset can be as little as one polygon, or it can be multiple polygons. The controller 38 can determine how many polygons to project at a time, as well as the location of the end effector 30, and more specifically the objective 60, with respect to the surface when projecting the image onto the surface, among other things. The movement of the end effector 30, as well as the rotary stage 90, can be controlled by the controller 38, as explained below.

A person skilled in the art will understand the typical properties of a controller configured to perform the functions provided for herein, and thus a detailed explanation of every component of the controller is not necessary. Generally, the controller includes a computer processor for operating the processes provided for herein, memory or storage to store data and information received about the system, the image to be printed, and the surface onto which the image is to be printed, among other items of data or information, a power source to provide power to the components of the controller and/or of the end effector 30, and a substrate onto which each of the compute processor, memory, and power source can be disposed.

Further, a person skilled in the art will recognize that the controller 38 may also take instructions from a master program run on a standard computer processing unit that can be part of a system. A person skilled in the art would understand how that set-up would operate in view of the present disclosure, and thus providing additional information about such a computer processing unit is unnecessary. In such embodiments, the controller 38 can be configured to control the spatial light modulator while taking directions from the bigger system running the software described herein or otherwise known and/or derivable by a person skilled in the art in view of the present disclosures. The bigger system may control the robotic manipulator 20 for example, and be responsible for the coordination of the entire system 10, sending some instructions to the controller 38 to operate the spatial light modulator 40 and its related components (e.g., the first light source 34, the second light source 36, and the DMD 52). In other embodiments, the controller 38 can be configured to handle providing the necessary instructions to all components of the system 10.

The second light source 36 also can be disposed within the housing 32. The second light source 36 can be used for curing the photoresistive or light-sensitive material disposed on the surface of the three-dimensional object onto which the image is projected. Many different types of light sources can be used to cure or otherwise activate the photoresistive or light-sensitive material to print the image on the object. For example, the second light source 36 can be a blue LED designed to be exposed to the surface and cure a designated portion thereof for a period of time (e.g., 0.1 seconds), before moving to another portion to do the same. The period of time for exposure to cure the image can depend, at least in part, on the parameters of the photoresistive material and magnification of the projected image. Similar to the first light source 34, the second light source can be a light-emitting diode (LED) that includes red and blue visible wavelengths of about 275 lux and about 100 lux, respectively. In some embodiments, including the illustrated embodiment, the first and second light sources can be combined to be a single light source that provides light for two different purposes—one to provide incident light to the spatial light modulator 40, and more specifically the DMD 52 (or other similarly-suited device), and the second to cure the photosensitive material. Both light sources can be incident on the maskless lithography system, with the only difference between them being the wavelength, with one wavelength being optimized for visualizing the pattern on the surface before exposure and the other being optimized for curing. The optimization is within a person of ordinary skill in the art in view of the present disclosures. Further, although the illustrated embodiment provides for each of the first and second light sources 34, 36 being disposed within the housing, in other embodiments either or both of the light sources 34, 36 can be disposed outside of the housing and/or disposed separate from the end effector 30 entirely.

Light that passes out of the housing 32 through the opening 44 can pass to and through the objective or lens 60. The objective 60 can be rotatable with respect to the housing in a direction R to adjust its focus. It can include a gripping portion 62 that can be grasped when rotating the objective 60, and a glass lens 64 disposed at a distal end 60d of the objective 60. In one exemplary embodiment, the objective 60 is a 5× Mitutoyo objective that is available through Edmund Optics Inc. of Barrington, N.J. It has a field of view of 4 millimeters, resolving power of 2.0 micrometers with a 0.14 numerical aperture, a depth of field of 14.0 micrometers, and a long working distance of 34 millimeters. Further, increased resolution up to approximately 200 nanometers or an increased projection area of up to approximately 2500 millimeters can be selected by changing the projection lens. The objective 60 can be removably and replaceably coupled with the housing 32, or with the feedback assembly 70 as shown, such that objectives can be interchangeably used in conjunction with the system 10 based, at least in part, on the size of the surface onto which is being printed, and the desired zoom and focus associated with the image to be projected onto the surface, among other things. Generally, the distance between the DMD 52 and the objective 60 is kept constant.

Figure 4:
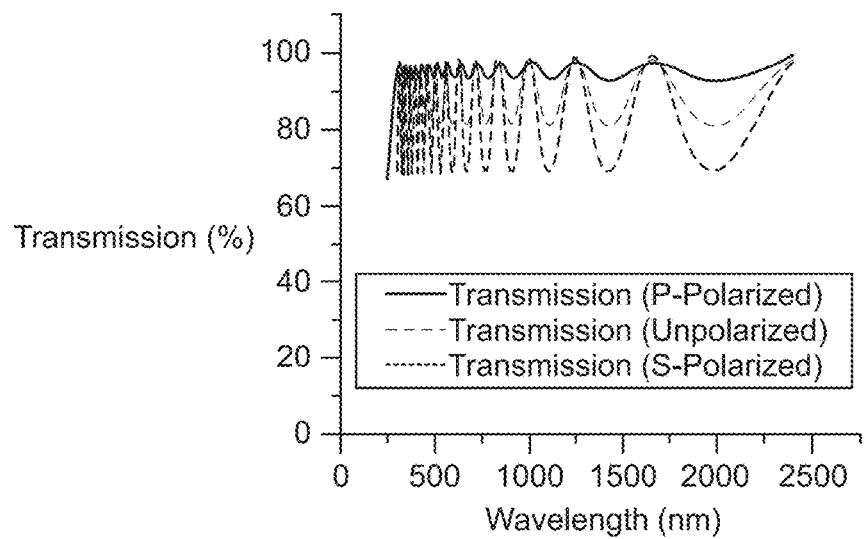
FIG. 4 is a graph illustrating transmission data for a beamsplitter that can be part of an end effector assembly.
Figure 5A:
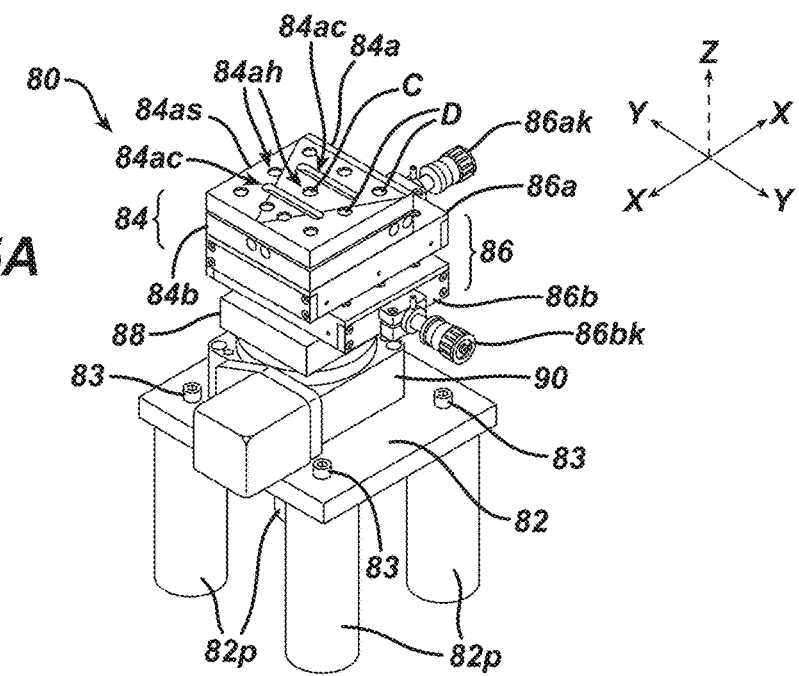
FIG. 5A is an isometric view of the object-holding platform of FIG. 1.
Figure 5B:
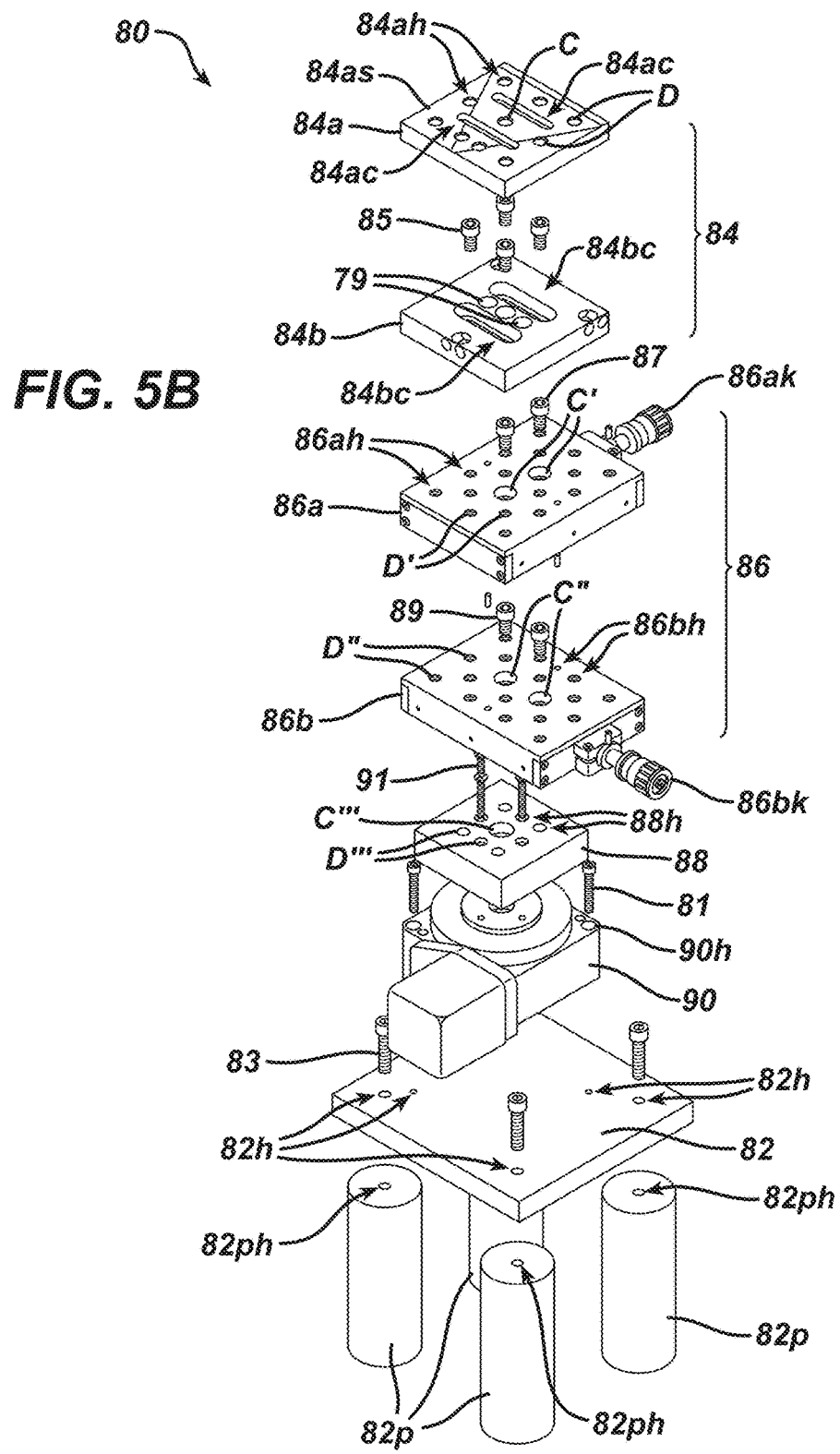
FIG. 5B is an isometric, exploded view of the object-holding platform of FIG. 5A.
Figures 5C, 5D:
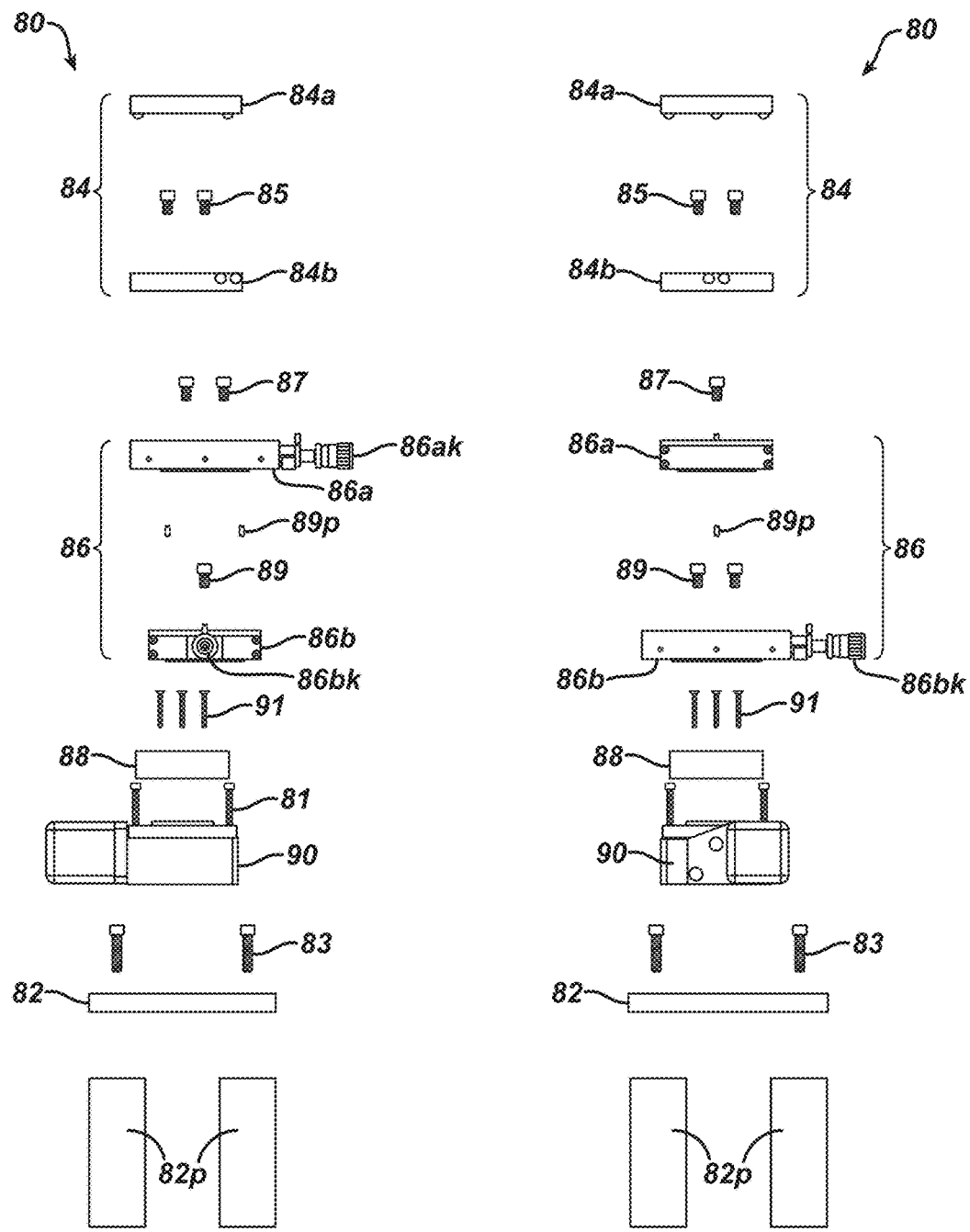
FIG. 5C is a side, exploded view of the object-holding platform of FIG. 5A.
FIG. 5D is a front, exploded view of the object-holding platform of FIG. 5A.

The feedback assembly 70 for helping monitor the quality of the image being projected onto the surface can include a beamsplitter 72 and a beam analyzer 74. The beamsplitter 72 can be configured to split any beam of light reflected by the spatial light modulator 40 into two beams of light, with the first passing into and through the objective 60 and the second being directed to the beam analyzer 74. In some exemplary embodiments, the beamsplitter is a Cube-Mounted Pellicle Beamsplitter distributed by ThorLabs, Inc. of Newton, N.J. It has an 8:92 (R:T) reflectance and transmission ratio and is uncoated with a wavelength range of about 400 nanometers to about 2400 nanometers. The beamsplitter has a very thin cross section—approximately 2 micrometers—thus eliminating ghosting and removing chromatic aberration. As illustrated by FIG. 4, due to thin film interference, there is a sinusoidal variation in the R:T spectrum for various transmissions, whether P-polarized, S-polarized, or unpolarized.

The beam analyzer 74 can be configured to receive the second light beam from the beamsplitter 72 and subsequently analyze that light beam using a variety of techniques. In the illustrated embodiment, the beam analyzer 74 includes a camera or camera sensor 76 to receive the second light beam and a charge coupled device (CCD) 78 configured to communicate the light beam to an external display to display an image associated with the same or to an auto-focusing device. When using an external display, a user can review and evaluate the image to determine if it looks appropriately sized, focused, and/or otherwise is properly configured for display and subsequent printing on a surface of a three-dimensional object. The user can then adjust various parameters to provide for the proper size, focus, and overall configuration based on the image generated from the feedback assembly 70. When using an auto-focusing device, the device itself can be configured to adjust the relevant parameters to provide the desired size, focus, and overall configuration based on the auto-focusing device's analysis of the second light beam, and the image associated therewith. Similar to the manual methodology provided for above, the auto-focusing device can be adjust various parameters to provide the proper size, focus, and overall configuration of the image based on information generated from the feedback assembly 70.

In some exemplary embodiments, the camera 76 can be an ultra-compact USB3 vision camera from XIMEA Corp. of Golden, Colo. The camera communicates via USB 3.0, and thus allows data transfer of up to 5 gigabits per second. The maximum frame rate achievable for full sensor (2048×2048) video can be 90 frames per second in an 8-bit capture. The camera has a pixel pitch of 5.5 micrometers, and the size of the sensor is 25.4 millimeters along its diagonal. The sensor is a Complementary Metal Oxide Semiconductor (CMOS) with a global shutter.

A longpass filter 75 can be positioned between the beamsplitter 72 and the beam analyzer 74. The longpass filter 75 can filter blue light from the second light beam before the beam arrives at the camera sensor 76 to enable viewing the camera in green and red light without bleaching that can occur due to the bright exposure in blue light. In some exemplary embodiments, the longpass filter 75 is the FGL495 colored glass filter distributed by ThorLabs, Inc., which has a 495 nanometer longpass. Further, each of the long pass filter 75 and beam analyzer 74 can be slidably disposed along one or more rods 77 (as shown, four rods) extending from the beamsplitter 72. The rods can extend substantially normal to a central longitudinal axis L extending centrally through the opening 44, the beamsplitter 72, and the objective 60. The longpass filter 75 and the beam analyzer 74 can be slid along the rods 77 to adjust a location of each with respect to the beamsplitter 72, for instance to improve the focus associated with the second light beam that they receive.

Additional components of the end effector 30 are illustrated in FIGS. 2A-2D, particularly within the housing 32. A person skilled in the art will understand what these components are and how they operate in light of the present disclosures and the knowledge of the skilled person about some of the exemplary, off-the-shelf components referenced herein. Accordingly, it is not necessary to label and/or describe each and every component of the end effector 30. Likewise, a person skilled in the art will understand other components or features that can be incorporated as part of the end effector without departing from the spirit of the present disclosure to improve aspects thereof, including the projection of light on the surface, the focus and quality of the image associated with the projected light, and the curing of photoresistive or light-sensitive materials.

The printing processes described herein rely on the ability of the end effector 30 to be moved relative to the three-dimensional object having a surface onto which the end effector 30 prints, and/or the three-dimensional object moving relative to the end effector 30. In the illustrated embodiment, the end effector 30 is able to move across six degrees of freedom as a result of being mounted to a robotic manipulator 20 that is able to move across six degrees of freedom. As shown, the end effector 30 can be mated to a distal end 22d of an arm 22 of the robotic manipulator 20, for instance by mating complementary mating features of the distal end 22d with the alignment pin 42 (FIG. 2C) disposed on the proximal end 32p of the housing 32. The arm 22 can be configured to move in both directions along each of an X plane, a Y plane, and a Z plane, thus providing the six degrees of freedom to the end effector 30. One non-limiting example of a robotic manipulator 20 that can be used in conjunction with the present disclosures is the Adept Viper™ s650 six-axis robot, which is manufactured by Adept Technology Inc. of Pleasanton, Calif. The Adept Viper™ s650 six-axis robot can be mounted to a precision optical table 12 as shown, or any other surface, and it provides the attached end effector 30 a reach of approximately 650 millimeter.

A person skilled in the art will understand other ways by which the end effector 30, and more particularly the objective 60, can be moved across six degrees of freedom. In some instances, the objective 60 may not be coupled to the end effector 30, i.e., it can be remote from the housing 32. In such instances, the objective 60 can move across the six degrees of freedom while components of the end effector 30 may move less than the six degrees of freedom. This is because, in use, it is the positioning of the objective 60 with respect to the surface of the three-dimensional object onto which is being printed that is adjusted and monitored to insure that the printed image is properly focused and otherwise accurate. By way of non-limiting example, in some embodiments, the six-axis robot can be replaced by a three-axis gantry system having three-axis yaw, pitch, and roll end effector that can be incorporated with the relevant teachings provided for the end effector 30.

The three-dimensional object having a surface(s) onto which an image is printed by the end effector 30 can be held in one or more particular positions during the printing process using a variety of techniques, assemblies, and devices known by those skilled in the art. Some such assemblies and devices can hold the object in a stationary position or location throughout the printing process, although, others can be configured to adjust a position or location of the object with respect to the objective 30 during the printing process to more easily access particular locations on the surface for printing. Such movement can occur in lieu of, or typically better yet, in combination with, moving the objective 60 relative to the object onto which the image is being printed. In the illustrated embodiment, an object-holding platform affords the system a seventh degree of freedom, thus a degree of freedom beyond the six afforded by the robotic manipulator 20.

Together the robotic manipulator 20 and the end effector 30 can be considered a lithography system. In some non-limiting, exemplary embodiments of such systems, specifications of the same can be the following: (1) the camera frame rate can be approximately in the range of about 60 frames per second to about 300 frames per second; (2) the latency can be approximately 16 milliseconds; (3) the field-of-view (5×) can be approximately 5 millimeters; (4) the camera resolution can be approximately 5 micrometers; (5) the digital light processing frame rate can be approximately in the range of about 1440 frames per second to about 10,000 frames per second; (6) the wavelength of the first light source can be approximately 405 nanometers; and (7) the depth of field can be approximately in the range of about 20 micrometers to about 100 micrometers, and in some embodiments it can be about 20 micrometers.

FIGS. 5A-5D illustrate one exemplary embodiment of an object-holding platform 80. As shown, the platform 80 includes a mounting plate 82 having optical posts 82p, a kinematic mount 84, precision stages 86, an adapter plate 88, and a rotary stage 90. The components of the platform 80 work together, and with outside components such as vices and other tools capable of maintaining a location of a three-dimensional object with respect to the kinematic mount 84, to hold the three-dimensional object as desired and to move the three-dimensional object with respect to the objective 60.

The kinematic mount 84 includes a top plate 84a and a bottom plate 84b. The top plate 84a has a top, object-facing surface 84as that is configured to receive a three-dimensional object, or receive tools used to hold three-dimensional objects at a stationary location with respect to the surface 84as. As shown, the features for holding the object at a stationary location include holes 84ah (a central counterbore C and nine tapped holes D) and channels 84ac, which provide the same mounting functionality as an optical breadboard. The arrangement of holes 84ah and channels 84ac provide versatility in where and how a three-dimensional object is mounted to the kinematic mount 84 for being printed on by the end effector 30. Of course, any number and configurations of holes 84ah and channels 84ac can be formed on the top plate 84a, and other features can also be incorporated into the top plate 84a for use in holding a three-dimensional object at a stationary location with respect to the surface 84as. The triangle formed on the top surface 84as illustrates a high-load mounting region of the plate 84a. The illustrated configuration is the configuration included in the KB3×3—Complete 3"×3" Kinematic Base (top and bottom plates), which is distributed by ThorLabs, Inc. Other configurations and sizes of top plates 84a are available from ThorLabs, Inc. for interchanging different optomechanical set-ups.

The bottom plate 84b can be configured to couple to one of the precision stages 86, the adapter plate 88, and the rotary stage 90. In the illustrated embodiment, the bottom plate 84b is configured to be coupled to a top precision stage 86a of the precision stages 86, by way of fasteners 85 extending through channels 84bc of the bottom plate 84 and into holes 86ah of the top precision stage 86a. The illustrated configuration is the configuration included in the aforementioned KB3×3—Complete 3"×3" Kinematic Base, although other configurations and sizes of bottom plates 84b are available from ThorLabs, Inc. for interchanging different optomechanical set-ups. As designed, the top and bottom plates 84a, 84b are magnetically coupled using high-strength magnets 79 disposed in the surfaces of the plates 84a, 84b facing each other (the magnets for the top plate 84a are not visible, but they are generally opposed to the magnets 79 disposed in the bottom plate 84b). Although the illustrated embodiment provides for a kinematic mount from ThorLabs, Inc., a person skilled in the art will recognize other kinematic mounts that can be used, including those from other manufacturers and distributors, in conjunction with the present disclosures.

One or more precision stages 86 can be provided to enable movement of the kinematic mount 84, and to help remove the possibility of any error between the kinematic mount 84 and the rotary stage 90 z-axis. In the illustrated embodiment, both a top precision stage 86a and a bottom precision stage 86b are provided, with one stage 86a being configured to move the kinematic mount 84 in both directions of the X plane and the other stage 86b being configured to move the kinematic mount 84 in both directions of the Y plane. As shown, both stages 86a, 86b include a plurality of holes 86ah, 86bh (two counterbores C', C" that are larger than 16 tapped holes D', D") formed therein, which can be used to mount the stages 86a, 86b with respect to each other and with respect to the kinematic mount 84 and one of the adapter plate 88 and rotary stage 90. In the illustrated embodiment, the kinematic mount 84 is mounted to the top stage 86*a* by way of the fasteners 85, the top stage 86*a* is mounted to the bottom stage 86*b* by way of fasteners 87 extending through the holes 86*ah* and into the holes 86*bh*, and the bottom stage 86*b* is coupled to the adapter plate 88 by way of fasteners 89 extending through the holes 86*bh* and into holes 88*h* of the adapter plate 88. Further, alignment pins 89*p* can be provided to keep the translation axes of the two stages 86*a* and 86*b* orthogonal to each other. Each plate 86*a*, 86*b* includes differential adjustment knobs 86*ak*, 86*bk* for translating the plates in both directions along their respective planes. The illustrated stages 86*a*, 86*b* are both a PT1A—Single-Axis Translation Stage with Differential Adjuster, which is distributed by ThorLabs, Inc., and thus as configured, 25 micrometers of translation are provided per revolution over a 250 micrometer range, with graduations every 0.5 micrometers. A person skilled in the art will recognize other precision stages, or other components for enabling movement of the kinematic mount 84, that can be used in conjunction with the present disclosures.

The adapter plate 88 is provided to assist in mating the bottom precision stage 86*b* with the rotary stage 90. This is because the particular precision stage provided for in the illustrated embodiment is not necessarily conducive to being mated directly to the rotary stage 90. Thus, the adapter plate 88 has been fabricated to allow the bottom precision stage 86*b* to be mated to the adapter plate 88 by way of the fasteners 89, and the adapter plate 88 to be mated to the rotary stage 90 by way of fasteners 91 that extend through holes 88*h* of the adapter plate 88 and into holes 90*h* formed in the rotary stage 90. As shown, the adapter plate 88 includes a plurality of holes 88*h* (a single counterbore C''' and eight tapped holes D''') formed therein. The holes 88*h* can have any configuration, and other features besides holes and fasteners can be used to assist in coupling the precision stage(s) 86 with the rotary stage 90. The configuration of coupling features on the adapter plate 88, however, are typically located to allow for mating with both the precision stage 86*b* (or whatever component of the platform 80 that is disposed directly above the adapter plate 88) and the rotary stage 90. In other embodiments, an adapter plate 88 may be eliminated and the one or more precision stages 86, or the kinematic mount 84, can be coupled directly to the rotary stage 90.

Figure 6:
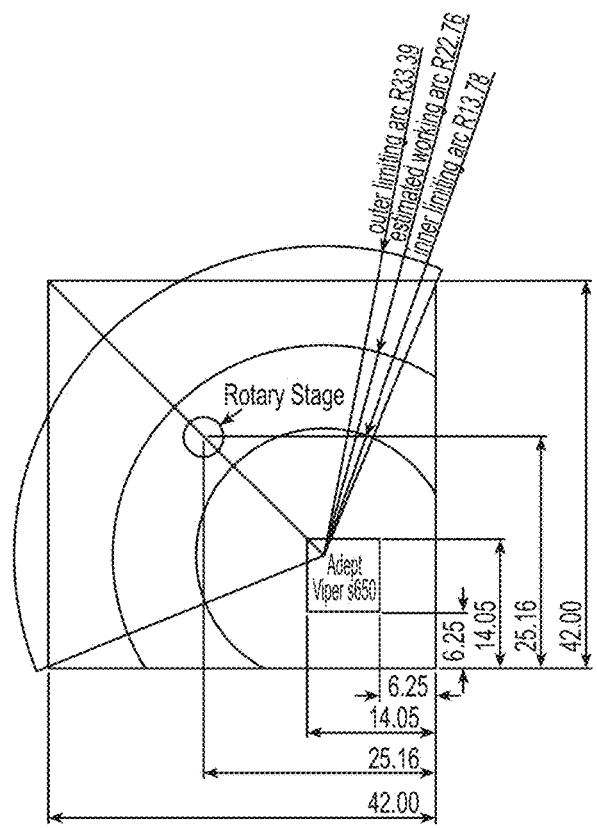
FIG. 6 is a schematic, top view of a working curve of robotic manipulator of FIG. 1 compared to the position of an object mounted to the object-holding platform of FIG. 1, with the dimensions illustrated being in inches.

The rotary stage 90 enables a larger work envelope for the printing to occur by providing at least one additional degree of freedom with respect to the objective 60 and the object coupled to the platform 80 onto which the printing occurs. The rotary stage 90 an be configured to rotate in either the clockwise or counterclockwise direction, which in turn rotates each of the components disposed above it (e.g., the adapter plate 88, the precision stages 86*a*, 86*b*, the kinematic mount 84, and a three-dimensional object coupled to the kinematic mount 84) in the same direction because they are coupled thereto. While any number of rotary stages can be used in conjunction with the present disclosures, in the illustrated embodiment the rotary stage is a B5990TS rotary stage manufactured by Velmex, Inc. of Bloomfield, N.Y. FIG. 6 illustrates the geometric constraints in the work-cell of the robotic manipulator 20 along with a location of the rotary stage 90 relative to the robotic manipulator 20, and includes a working curve of the robotic manipulator 20 compared to the position of a three-dimensional object onto which is being printed. As demonstrated by this figure, the use of the rotary stage 90 in conjunction with the robotic manipulator 20 provide for additional flexibility and reach. In particular, based on the location of the rotary stage 90 illustrated in FIG. 6, an object to be printed on mounted to the stage would have approximately half of its surface area inaccessible by the robotic manipulator 20 due to the proximity of the surface of the object to the illustrated working arc. By actuating the rotary stage, for instance 180 degrees, the surface of the object can be brought into an orientation where significantly more of the surface can be reached and printed on. In fact, for an object that has a width or diameter that is approximately the size of or smaller than the size of the rotary stage, and even about two times larger (or more possibly), basically the entire surface of the object can be printed on except for any portions of the surface area covered by a component used to maintain a location of the object with respect to the rotary stage 90. Still further, additional components can be included as part of the system, such as a gantry for the robotic manipulator 20, to provide even further flexibility and reach.

In the illustrated embodiment, the rotary stage 90 is mounted to a mounting plate 82, which has four optical posts 82*p* extending therefrom. The combination of the plate 82 and posts 82*p* allow the rotary stage to be mounted to the precision optical table 12 such that the platform 90, and thus a three-dimensional object associated therewith, is positioned at a particular location with respect to the robotic manipulator 20 for printing on the object. The optical posts 82*p* in the illustrated embodiment are P4 optical posts, which are distributed by ThorLabs, Inc. The thickness of the plate 82 in the illustrated embodiment is 12.5 millimeters and the posts 82*p* in the illustrated embodiment have a length of 100 millimeters (with a tolerance of ±0.127 millimeters), although a person skilled in the art will recognize many different sizes the plate 82 and posts 82*p*, as well as the other components of the platform 80, and the system 10 as a whole, can have without departing from the spirit of the present disclosure. As shown, fasteners 81 extend through holes 90*h* formed in the rotary stage 90 and into holes 82*h* formed in the plate 82 to couple the rotary stage 90 to the plate 82, and fasteners 83 extend through holes 82*h* of the plate 82 into holes 82*ph* formed in the posts 82*p* to couple the plate 82 to the posts 82*p*. By way of non-limiting examples of other possible configurations, in some other embodiments, the plate 82 and posts 82*p* can be of a unitary construction, and/or the rotary stage 90 can also be part of such a unitary construction, or the rotary stage 90 can be mounted directly to the precision optical table 12. Other devices, tools, and systems can also be used in place of the plate 82 and posts 82*p* to position the rotary stage 90 at a desired location with respect to the objective 60 and/or the robotic manipulator 20.

Figure 7:
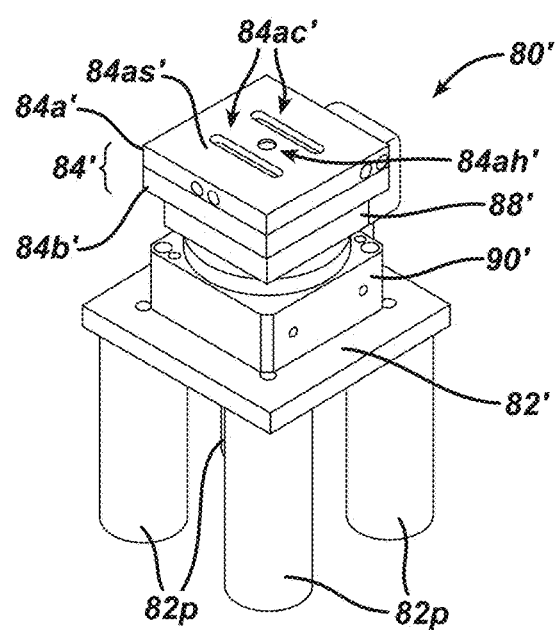
FIG. 7 is another exemplary embodiment of an object-holding platform.
Figure 8A:
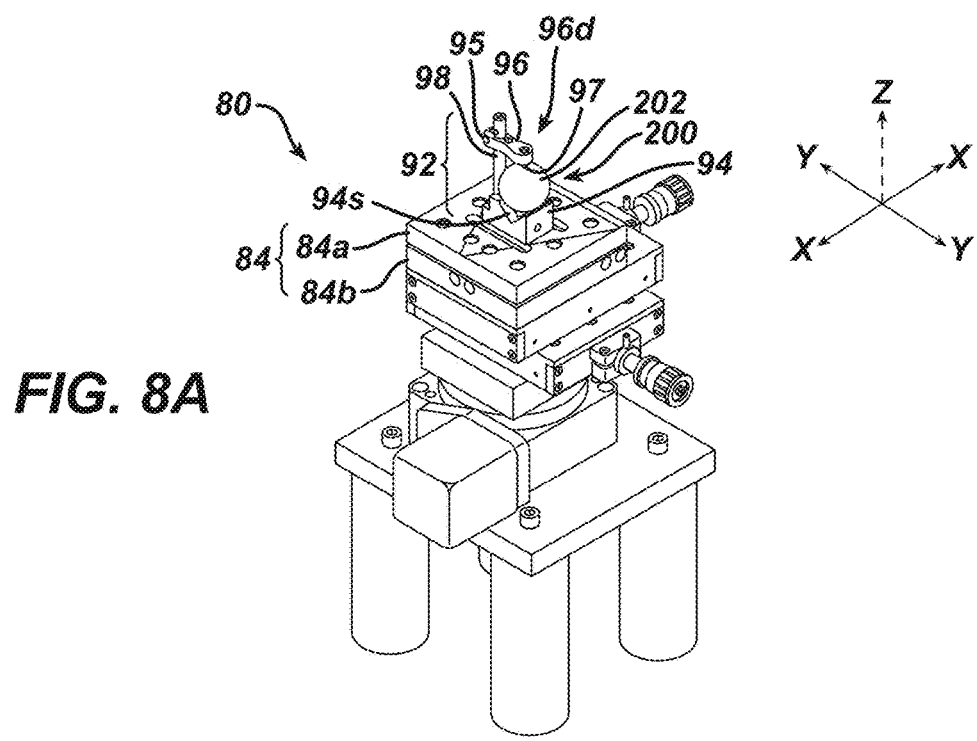
FIG. 8A is an isometric view of the object-holding platform of FIG. 5A having a three-dimensional object mounted to the platform.
Figure 8B:
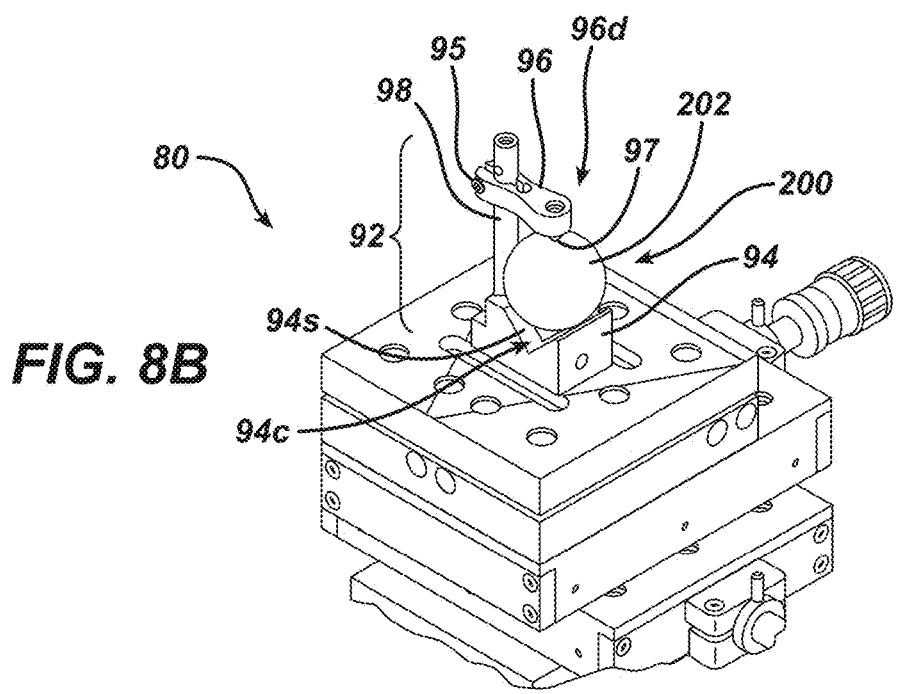
FIG. 8B is an isometric, detailed view of the object-holding platform of FIG. 8A.
Figure 8C:
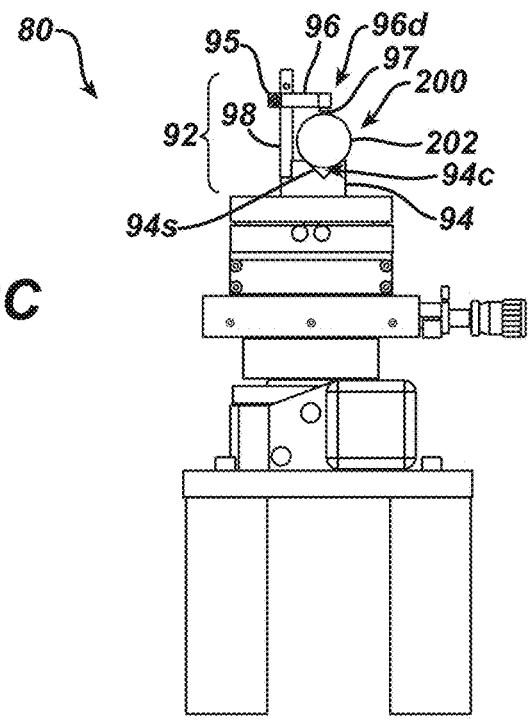
FIG. 8C is a side view of the object-holding platform of FIG. 8A.
Figure 8D:
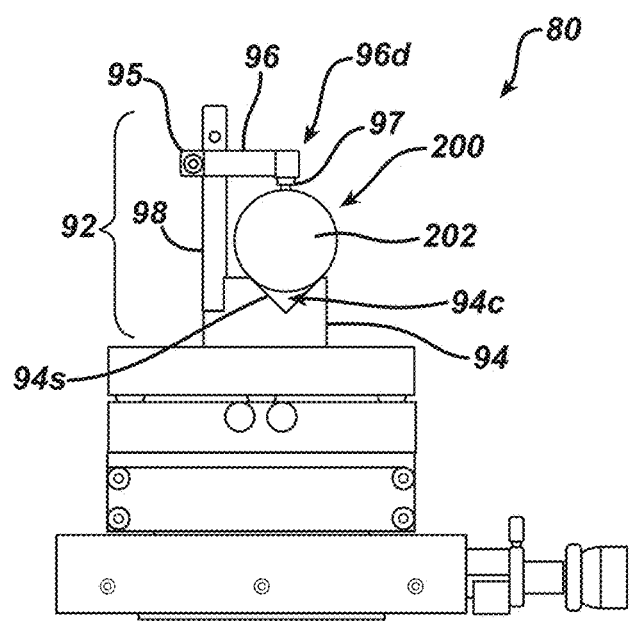
FIG. 8D is a side, detailed view of the object-holding platform of FIG. 8C.

FIG. 7 illustrates another embodiment of an object-holding platform 80'. The object-holding platform 80' is similar to the object-holding platform 80. As shown, it includes a mounting plate 82' having optical posts 82*p'*, a kinematic mount 84', an adapter plate 88', and a rotary stage 90'. The mounting plate 82', optical posts 82', and rotary stage 90' are similar to the mounting plate 82, optical posts 82*p*, and the rotary stage 90 described above. The kinematic mount 84' is similar to in that it includes both a top plate 84*a'* and a bottom plate 84*b'*, however a configuration of the surface 84*as'* of the top plate 84*a'* is different. The surface 84*as'* is still capable of holding a three-dimensional object at a stationary location with respect to the surface 84*as'*, and is likewise able to receive tools used to hold a three-dimensional object at a stationary location. The present illustration, however, demonstrates one of many other configurations for a top surface of a kinematic mount, and includes two channels 84ac' and a single hole 84ah' disposed between the two channels 84ac'.

Further, the platform 80' does not include precision stages, and thus the adapter plate 88' is configured to mate directly to the bottom plate 84b' of the kinematic mount 84' and the rotary stage 90' since, as designed, the bottom plate 84b' is not easily mountable to the rotary stage 90' directly. The purpose of the adapter plate 88' is thus similar to the adapter plate 88, and the configuration provided for on the plate 88' is one that is configured for use with the kinematic mount 84' and the rotary stage 90'.

FIGS. 8A-8D illustrate the object-holding platform 80 having a three-dimensional object 200 temporarily mounted or otherwise coupled thereto. As shown, a vice 92 is coupled to the kinematic mount top plate 84a and is configured to hold the three-dimensional object 200. In the illustrated embodiment, a bottom plate 94 of the vice 92 is coupled to the kinematic mount top plate 84a, for instance by disposing a fastener into the counterbore C (FIGS. 5A and 5B), and a top plate 96 of the vice 92 is slidably coupled to the bottom plate 94 by way of a rod 98 extending away from the bottom plate 94 in the Z plane as shown. A location of the top plate 96 with respect to the bottom plate 94 can be adjusted by sliding the top plate 96 along the rod 98 and operating a first locking mechanism 95 to set a position of the top plate 96 on the rod 98. A distal tip 96d of the top plate 96 can include a second locking mechanism 97 configured to be adjustable with respect to a top surface 94s of the bottom plate 94 to engage the three-dimensional object 200 disposed therebetween to temporarily lock the position of the three-dimensional object with respect to the vice 92, and thus the object-holding platform 80. As shown, the second locking mechanism 97 can be a rotatable pin that can be moved towards and away from the top surface 94s to selectively engage and disengage a surface 202 of the object 200. In the illustrated embodiment, the surface 94s of the bottom plate includes a V-configuration such that the three-dimensional object 200, which as shown is a sphere, can be easily seated and held within a channel 94c formed in the plate 94 by the bottom of the V-configuration.

A person skilled in the art will recognize many other configurations that the plates 94, 96 of the vice 92 can have to temporarily hold a three-dimensional object at a stationary location, as well as other tools and the like that can be used to temporarily hold a three-dimensional object at a stationary location with respect to any or all of the object-holding platform 80, the objective 60, the end effector 30, and the robotic manipulator 20. The configuration of the tools such as vices used to temporarily maintain a location of a three-dimensional object with respect to any or all of the object-holding platform 80, the objective 60, the end effector 30, and the robotic manipulator 20 can depend, at least in part, on the other components of the system, the preferences of the user, and the size and shape of the three-dimensional object being held, among other factors. Thus, while the illustrated embodiment illustrates the three-dimensional object 200 as being a sphere, a three-dimensional object used in conjunction with the disclosed systems, devices, and methods can have a variety of shapes, and tools like vices can be selected and/or modified to work with objects of various configurations, sizes, and shapes. Likewise, all of the components of the system 10, including but not limited to the robotic manipulator 20, the end effector 30, the object-holding platform 80, and the rotary stage 90, as well as the other components discussed herein, can be sized, shaped, and configured for the use with various sized three-dimensional objects. The changing of the size, shape, and general configuration in accordance with the present disclosures does not depart from the spirit of the present disclosure, and thus small and large objects alike can be printed on using the techniques described herein. Some non-limiting examples of small and large objects on which or with which the present teachings, systems, and devices can be used include but are not limited to bowling balls (having a diameter of approximately 8.5 inches), ball bearings (having a diameter of approximately 1 inch), and small animal bones (having diameters or widths of approximately 2 inches to approximately 3 inches)

A three-dimensional object like the three-dimensional object 200 being held by an object-holding platform 80 can have a photoresistive (photosensitive) or light-sensitive material deposited on its surface 202. Techniques known by those skilled in the art for depositing such a material on the surface of an object can be used, including but not limited to cleaning the surface prior to applying the photoresistive material, for instance with acetone and isopropyl alcohol (IPA) and then drying it with a nitrogen gun, and applying a spray coating of such a material on the surface on which the printing is to occur. Exemplary photoresistive materials for use in conjunction with the present disclosures include MicroSpray™ photoresist material distributed by Micro-Chem Corp. of Westborough, Mass. and poly(ethylene glycol)diacrylate (PEGda) photoresist material. A thickness of the photoresistive material can be in the range of about 1 micrometer to about 10 micrometers, and in some instances it can be about 5 micrometers. A person skilled in the art will understand what other actions may be necessary to take to properly prepare the photoresistive material for use, such as letting it sit for a period of time before projecting and printing an image and/or heating or cooling the photoresistive material at appropriate times.

Further, in some embodiments, the system itself can be adapted to deliver the photosensitive material. By way of non-limiting example, a photosensitive material delivery nozzle can be provided (see nozzle 399 in FIG. 14, and the related description, provided below, as one, non-limiting exemplary embodiment), for instance at the distal end 22d of the arm 22 of the robotic manipulator 20, that is configured to apply any desired amount of photocurable material after any number of polygons has been exposed. This can be useful when printing in any of the methods described herein, including when printing three-dimensional structures, as detailed below. Other locations and configurations of a photocurable delivery mechanism can also be incorporated with the systems, devices, and methods described herein.

Figure 9A:
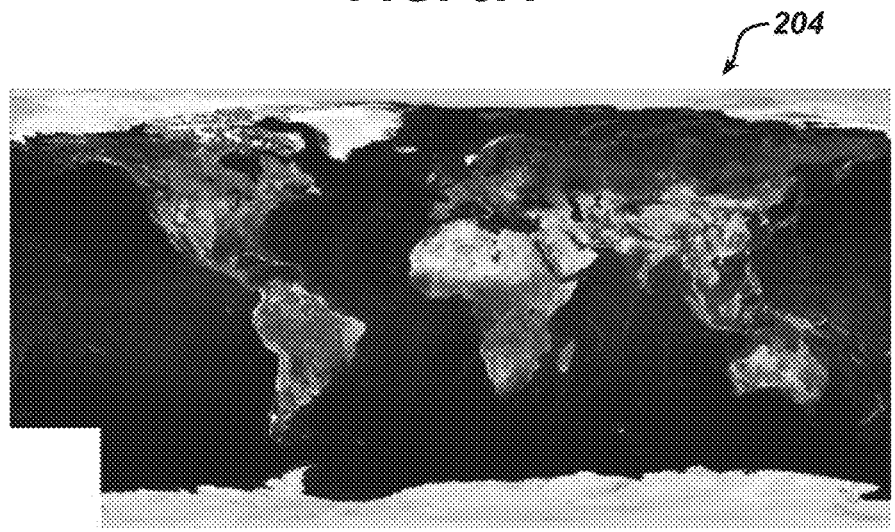
FIG. 9A is a top view of one exemplary embodiment of an image to be printed onto a three-dimensional object.
Figure 9B:
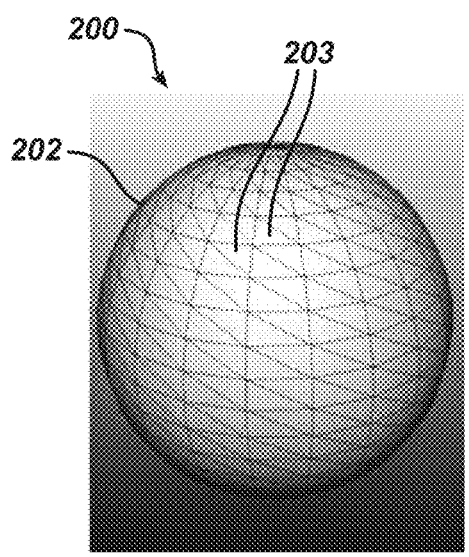
FIG. 9B is a perspective view of one exemplary embodiment of a three-dimensional object onto which the image of FIG. 9A can be printed, the three-dimensional object having a plurality of triangles associated with a surface thereof.
Figure 9C:
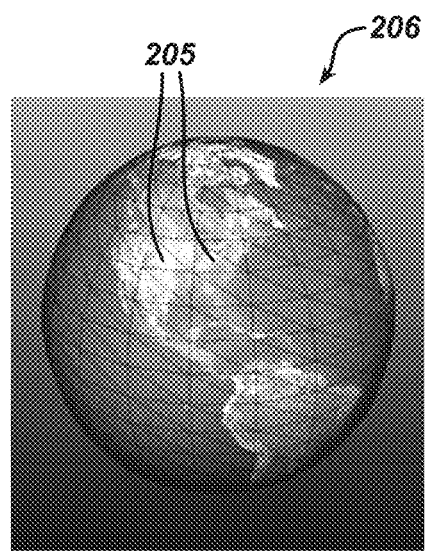
FIG. 9C is a perspective view of the three-dimensional object of FIG. 9B having the image of FIG. 9A projected thereon and triangles associated therewith for illustrative purposes as the triangles are not actually projected onto the surface.

FIGS. 9A-9C illustrate one example of a technique for printing an image on a surface of a three-dimensional object. FIG. 9A shows the image to be printed onto the surface, and is a world map 204. Although not illustrated, a plurality of polygons, such as a plurality of triangles, can be associated with the map 204. The polygons can be overlaid on top of the map 204 such that each polygon defines a subset or portion of the entire image. The portion of the image provided for within the area of the polygon can be referred to herein as a texture or region, and thus references to a texture of an image herein can be a reference to what a portion of the image looks like within the confines of the defined area, the defined area being one or more of the polygons. In some embodiments, the image, as shown the map 204, can already have the polygons associated with it, and thus the controller 38 can receive and store the information or data about the relationship between the polygons and the map 204. In other embodiments, the system 10 can include one or more cameras associated with it to scan the map 204 into the system 10, and the controller 38 can associate the polygons with the map 204 and subsequently store the information or data about the relationship between the polygons and the map 204. In still other embodiments, the image of the map 204 can be pre-existing and thus provided to the controller 38 without requiring a separate scan, but then the controller 38 can perform the step of associating the polygons with the map 204 and subsequently storing the information or data about the relationship between the polygons and the map 204.

FIG. 9B shows the three-dimensional object 200 having the surface 202 on which the world map 204 is to be printed. As shown, the surface 202 has a plurality of polygons 203, as shown triangles, associated therewith such that each polygon defines a subset or portion of the entire surface 202. The plurality of polygons 203 can be referred to as a pattern of polygons, but the polygons do not necessarily have to be in any sort of pattern. Thus, while in the illustrated embodiment each triangle in a row of triangles is substantially the same size and configuration, various other polygon arrays can be used if desired, including multiple types of polygons at the same time, differently sized and shaped polygons, etc. The association of the polygons 203 with the surface 202 can be done in a variety of ways. In some embodiments, the surface 202 can have previously been mapped and already had the polygons 203 associated with it, and thus the controller 38 can receive and store the information or data about the relationship between the polygons 203 and the surface 202. In other embodiments, the system 10 can include one or more cameras associated with it to scan the three-dimensional object 200, and thus the surface 202 onto which an image is to be printed, into the system 10, and the controller 38 can associate the polygons 203 with the surface 202 and subsequently store the information or data about the relationship between the polygons 203 and the surface 202. In some exemplary embodiments, the scan is a UV scan, where the letters "U" and "V" denote the axes of the two-dimensional texture.

Once the information or data related to the polygons and the map 204 and the polygons 203 and the surface 202 are received and/or stored by the controller 38, the controller 38 can make various determinations about the information to formulate or scale an image 206 to be printed onto the surface 202 (or a three-dimensional structure as provided for below). The image 206, which is shown in FIG. 9C, includes the image of the map 204 having a plurality of polygons 205 associated with it. The scaling of the polygons 205 for this final image can be the result of processing the earlier described information or data to arrive at the image 206. While a ratio of polygons to surface area can depend on a variety of factors, including but not limited to the desired clarity of the image, the desired speed of printing, and the components of the system with which the process is being used, in some exemplary embodiments, a ratio of polygons associated with the surface of the three-dimensional object to an area of the surface of the three-dimensional object can be approximately equal to or greater than about 1 polygon per square millimeter to about 200 polygons per square millimeter, and in some exemplary embodiments it can be about 100 polygons per square millimeter. A person skilled in the art will recognize that a maximum achievable polygons per square millimeter (or other appropriate dimension) can change based, at least in part, on the structured light method used (e.g., DLP, DMD, LCOS, etc.)

Although the image 206 shows the polygons 205 formed on it, the polygons 205 represent a definition of an area to be printed, and are not actually drawn on the final image that results from performing this process. However, the resulting data or texture file of the controller 38 that represents the image 206 and the polygons 205 can look like the illustration provided in FIG. 9C and can be saved to have a .OBJ file format. If some other component of the system 10 performs the formation of the .OBJ file, e.g., a processor associated with the end effector 30, the file can then be imported to the controller 38 that houses software necessary to operate the components of the system 10. The texture file can then be used to progressively print subsets of the polygons 205 to eventually print the entire image 206 on the surface 202.

More particularly, a portion of the image 206 defined by one or more polygons of the polygons 205 can be printed at a time without printing the whole image all at once. This can be achieved by the controller 38 commanding the spatial light modulator 40 to project one or more polygons of the polygons 205, also referred to herein as a subset of the polygons 205. The controller 38 can determine a centroid of the subset using techniques for centroid determination known to those skilled in the art. If the subset is a single polygon, then the centroid of that polygon is determined, but if the subset if more than one polygon, then the centroid across the multiple polygons is determined. A location of the objective 60 with respect to the surface 202 can then be adjusted by moving some combination of the objective 202 and the surface 202 so that a plane P (FIGS. 2A-3D) of the objective 60 that is approximately normal to the central axis L (i.e., a plane extending across the glass lens 64 disposed at the distal end 60$d$ of the objective 60 such that the plane P is approximately aligned with or is substantially parallel to the lens 64) is approximately normal to the centroid of the corresponding polygon 203 on the surface 202. Further, the controller can command that a distance between a distal end of the objective 60 and the surface 202 be such that the projected image is properly focused. The distance may be adjusted based on analysis performed using the feedback assembly 70 as described above.

The size of the polygons 205 associated with the image 206 can be determined by the controller 38 after considering a depth of field of the projected image, as well as a thickness of the photosensitive material deposited on the surface 202. Calculating depth of filed can vary depending on its definition because in a real system there is no definite location at which an object becomes unfocused. Rather, it is gradual. Accordingly, in the present system 10, the controller 38 calculates the depth of field based on the following equation:

$$\delta = \frac{\lambda_o}{NA^2} + \frac{n}{M \cdot NA} e \qquad \text{Equation 1}$$

in which δ represents the depth of field of the system, λ represents the wavelength of light, n is the refractive index of the medium, NA is the objective numerical aperture, and e is the smallest resolvable feature by a detector placed in the image plane with a lateral magnification M. Notably, the first term in the above equation relates to the contribution of the numerical aperture of the objective 60 while the second term weights the circle of confusion. Based on the exemplary components provided for herein, in one embodiment the calculated depth of field was 28 micrometers at a 500 nanometers wavelength, which equals the manufacturer specification of ±14 micrometers for the 5× Mitutoyo objective.

Then, taking into account the depth of field of the system, and the local radius of curvature of the surface 202 (R), the following equation allows for the calculation of the parameter $\alpha^2$ that represents the area of the DMD 52 that can be used for each exposure:

$$\alpha^2 = 2R\sin^{-1}\left(\frac{\sqrt{2R\delta - \delta^2}}{R}\right)^2. \qquad \text{Equation 2}$$

Figure 10:
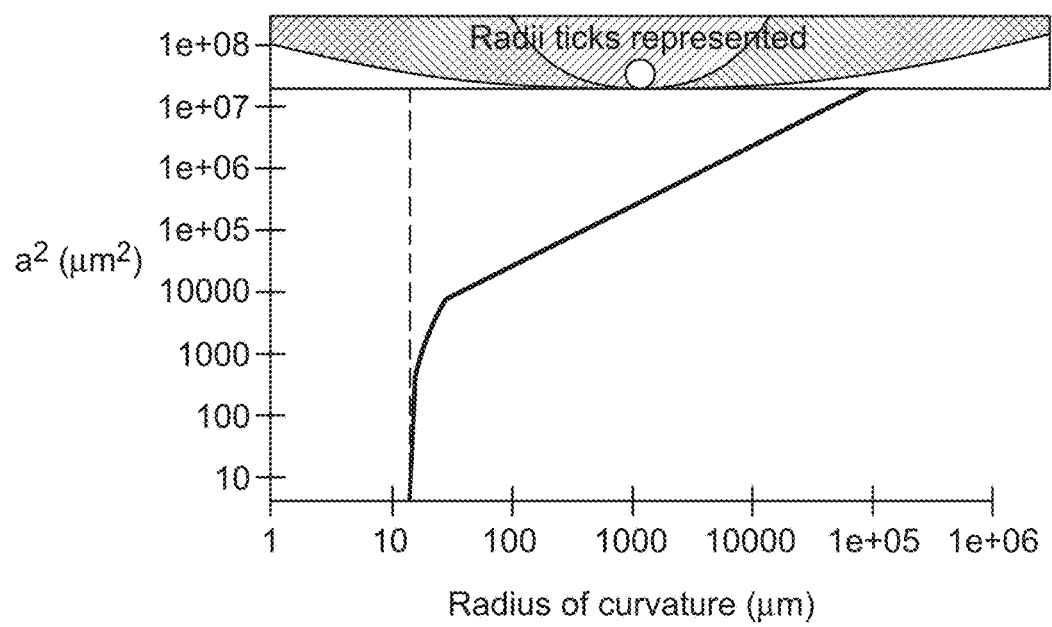
FIG. 10 is a graph illustrating a relationship between a radius of curvature of a three-dimensional object onto which an image is to be printed and a parameter that represents a patternable area from a digital micromirror device.

The relationship between the parameter $\alpha^2$ that represents the area of the DMD 52 that can be used for each exposure and the local radius of curvature of the surface 202 (R) is illustrated in FIG. 10, although if the radius of curvature is smaller than the depth of field of the system ($\delta$), then the value for the parameter $\alpha^2$ is just $(\pi R)^2$. This information is used to decide the polygon size when formulating the image, and the associated pattern of polygons associated therewith, that will be projected and printed onto the surface 202. To the extent the above equations might change as a result of using a polygon having a different shape (i.e., different than the triangles primarily discussed herein), a person skilled in the art will recognize how to appropriately scale the equations in view of the present disclosures and the knowledge of the skilled person. The controller 38 is able to adaptively change the size of the polygons according to the radius of curvature at a particular location of the surface 202 to satisfy the relationship illustrated in Equation 2 above.

Further, as contemplated herein, the system can be set-up for the polygons 203 associated with the surface 202 and the polygons 205 associated with the image 204 (or three-dimensional structure as provided for below) to be formulated in three-dimensions. For example, the end effector 30 can be moved in a continuous fashion, sweeping its intended path conformal to the three-dimensional surface and/or through the slices of the layer, thus forming a video that, at any instance, represents the still image that can otherwise be representative of the polygon given its position in the print route. As a result, any computed segmentation of an intended pattern of polygons to be printed, even in a three-dimensional context, can be considered within the scope of the present disclosure.

Once the objective 60 is properly positioned with respect to the surface 202, the first light source 34 can be turned on and spatial light modulator 40 can direct light for the portions of the image associated with the identified subset of the polygons 205. Thus, when the spatial light modulator includes the DMD 52, the mirrors 56 that reflect light to produce the portion, region, or texture of the image of the designated subset of polygons can be turned on to direct the light through the opening 44 and onto the outer surface 202 so that the relevant region of the image 206 is projected onto the surface 202. The other mirrors 56 can remain off. Once the portion of the image in the subset of polygons 205 is properly focused such that it is in a ready-to-print state, the second light source 36 can be operated to cure the photo-resistive or light-sensitive material disposed on the surface 202, thus resulting in that portion of the image 206 being printed on the surface. The steps of selectively other subsets (one or more polygons) of the polygons 205 to project and subsequently print the other portions of the image 206 can be repeated in a progressive manner until the entire image 206 has been projected and printed onto the surface 202. At least for efficiency purposes, the order of polygon subsets projected and printed onto the surface 202 can be sequential such that the portions of the image 206 are projected and printed from left to right and/or from top to bottom for example, although the order does not have to be sequential. In some instances, the processes described herein can be performed in a continuous rather than set-and-repeat fashion, thereby reducing overlap seams in certain photoresists. Further, adjacent polygons can be stitched across a planar surface, further enhancing efficiency.

After each subset is printed, or after the entire image 206 is printed, the process of exposing the image cures the photosensitive material and transfers the pattern into the material, and thus onto the surface. Developing the material then exposes the latent image. A person skilled in the art will recognize that other actions can be taken to set the image and the cured material on the surface of the object, including applying known materials to the surface 202. Notably, in conjunction with performing the methods described herein, the controller 38 can include software to operate a driver of the robotic manipulator 20 to move the end effector 30 and a driver of the rotary stage 90 to move the kinematic mount 84, and thus an object coupled thereto, while also commanding the spatial light modulator 40 to project portions of the image 206 on the surface 202 and commanding the second light source 36 to cure the photosensitive material so that the projected portion of the image 206 is set on the surface 202. For example, the software can include a C++ algorithm that integrates the drivers from the robotic manipulator 20, the rotary stage 90, and the portions of the end effector 30 that relate to projecting and curing the image.

Figure 11A:
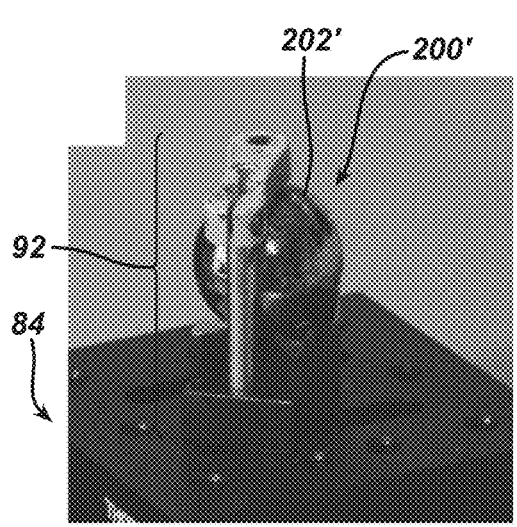
FIG. 11A is a perspective view of the object-holding platform of FIG. 5A having another three-dimensional object mounted to the platform.
Figure 11B:
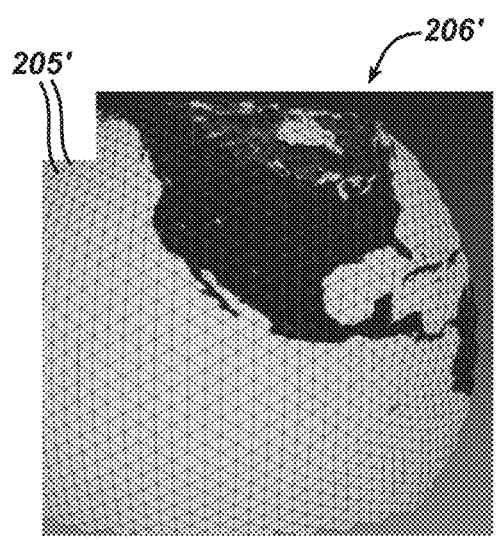
FIG. 11B is a perspective schematic view of a .OBJ file having texture of an image mapped onto a surface of a three-dimensional object.

FIGS. 11A-11B illustrate another example of printing similar to that of FIGS. 9A-9C. As shown in FIG. 11A, a three-dimensional object 200' having a surface 202', as shown a steel ball that is 25 millimeters in diameter, onto which an image is to be printed is coupled to the kinematic mount 84 using the vice 92. The surface 202' is coated with MicroSpray™ photoresist material having a thickness of approximately 5 micrometers. After application of the photoresist material, five minutes was allowed to pass, and then the MicroSpray™ photoresist material was headed with a hot air gun set to 116° C. for about five minutes.

Figure 11C:
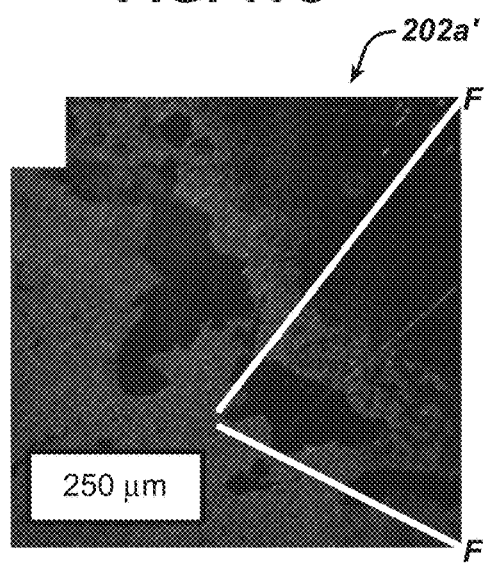
FIG. 11C is a photograph of the three-dimensional object of FIG. 11A illustrating a portion of the image of FIG. 11B printed on the object.
Figure 11D:
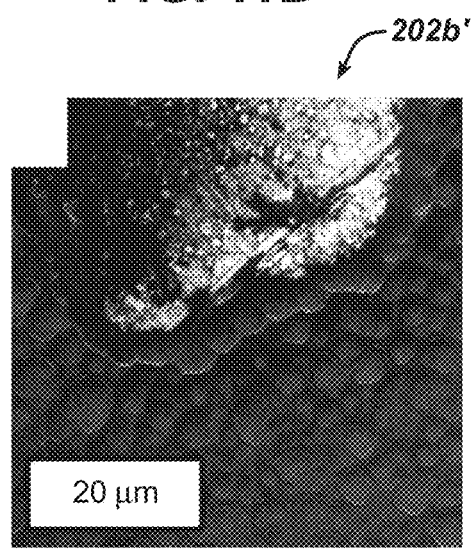
FIG. 11D is a scanning electron microscopy image of a portion of the image of FIG. 11C printed on the object, the portion being identified by the lines labeled F-F in FIG. 11C.

After receiving or creating information or data related to an image, once again a world map, to be printed onto the surface 202', including having a plurality of polygons (e.g., triangles) associated with both the surface 202' and the image to be printed onto the surface 202', the controller 38 formulates or scales a pattern of polygons 205' that are associated with the image 206' to be projected and subsequently printed on the surface 202'. The resulting image 206' having the polygons 205' associated therewith can be saved as a data or texture file having an .OBJ file format, the file being depicted in FIG. 11B. FIGS. 11C and 11D are images of the surface 202' after the progressive printing and curing processes are performed and the photoresistive or light-sensitive material is set. More particularly, for the illustrated embodiment, the period of time it took to project and cure each individual polygon across the surface was about 1.9 seconds. Once the entire image was exposed and printed, the object 200' was immersed in 0.1N NaOH for about five minutes without agitation. After five minutes the object 200' was then rinsed with deionized water to remove unpolymerized resist. The object 200' can then be dried, for instance using nitrogen or dry air. A hydrogel, such as PEGda, can be applied to curved substrates by dipping the substrate upside down in a 100 milliliter beaker, and smaller or planar areas can be covered by pipetting approximately 10 milliliters onto the surface 202' and wetting corners.

A photograph 202a' of FIG. 11C illustrates the state of Michigan from the world map having a 250 micrometer characteristic length for the triangles in the pattern, with feature resolutions approaching 5 micrometers, and a scanning electron microscope (SEM) image 202b' of FIG. 11D illustrates a bay of Michigan identified by lines F-F shown in FIG. 11C having a 20 micrometer characteristic length for the triangles in the pattern. The photograph 202a' and SEM image 202b' illustrate the precision that is possible using the systems, devices, and methods described herein to print on a surface of a three-dimensional object.

Figure 12:
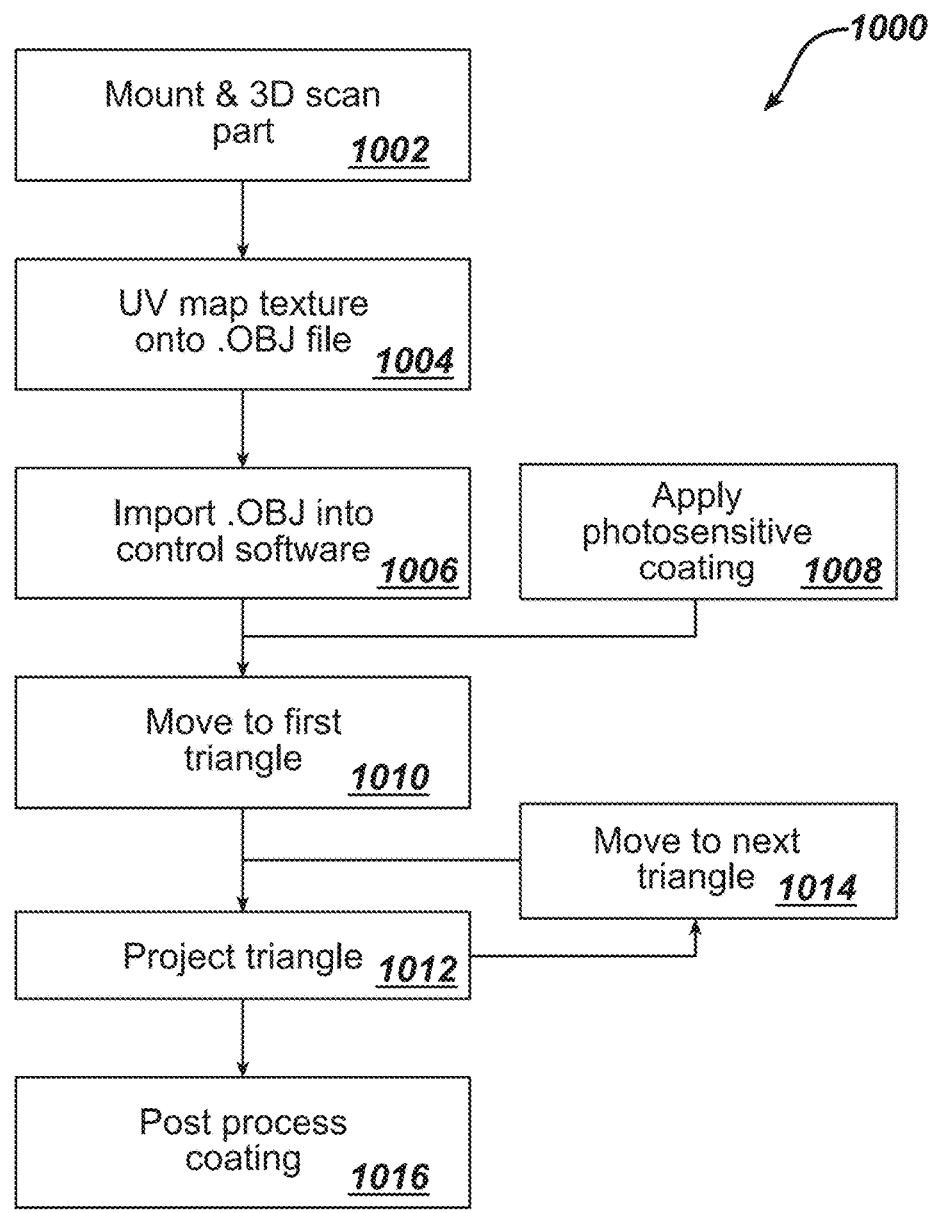
FIG. 12 is one exemplary embodiment of a flowchart for performing a method of printing on a surface of a three-dimensional object.

FIG. 12 illustrates a flowchart 1000 related to one exemplary embodiment for performing the printing techniques described above. As shown, the method can begin by mounting a three-dimensional object onto an object-holding platform and then a three-dimensional scan of that object can be performed, defined as step 1002. As explained above, the system does not necessarily have to perform the scan of the object, for instance in cases in which the object is known and the information that would otherwise be determined from the scan is already stored in the memory of the controller 38. For instances in which the system does perform the scan, one or more 3D scanners and related equipment and components manufactured by NextEngine, Inc. of Santa Monica, Calif. can be utilized. In step 1004, the UV map that results from the scan can be combined with data known or otherwise determined by the controller about the image to be printed, i.e., the texture of that image, can be combined to create a data or texture file having a .OBJ file format. In other words, the location of each polygon (e.g., triangle) in the digital space is associated with the corresponding polygon (e.g., triangle) in the real space, and subsequently associated with the region or texture contained within the borders of the polygon (e.g., triangle). In instances in which the controller 38 does not perform the generation of the .OBJ texture file, the .OBJ texture file can be imported to the controller 38 for subsequent use with the control software, as illustrated by step 1006. Prior to using the .OBJ texture file and software to project a portion of the image onto a surface, the surface is coated with a photosensitive or light-sensitive material, as shown by step 1008. A person skilled in the art will recognize that step 1008 can be performed prior to any of steps 1002, 1004, and 1006.

Once the controller 38 and the object have been properly prepared for the printing process, printing can begin by moving the objective 60 with respect to the surface of the object on which the printing is to occur such a plane of the objective 60 that is approximately normal to the central axis L of the objective 60 is approximately normal to the centroid of the first polygon (as illustrated a triangle) on the surface of the object. Further, a distance between the distal end of the objective 60 and the surface results is selected such that the projected image is properly focused. This movement is identified as step 1010. Once the objective 60 is properly aligned with the centroid of the triangle, the corresponding triangle of the image can be projected onto the surface, as shown by step 1012. Step 1012 can also include curing the triangle, as detailed above. After one triangle has been projected and cured or printed, the next triangle can be moved to, as shown by step 1014, and step 1012 can be performed again for this next triangle. This process can be continued, progressively, until all of the triangles to be printed are projected and printed onto the surface. Afterward, as illustrated by step 1016, a post-process coating can be applied to the fully printed image. Alternatively, the post-process coating can be applied progressively during the printing process, for example after each triangle is projected and cured, the post-process coating can be applied. Although the flowchart 1000 describes this process as being applied on a triangle-by-triangle basis, as described herein, the controller 38 can be operated to print multiple triangles (or other types of polygons) at a time if desired.

Figure 13A:
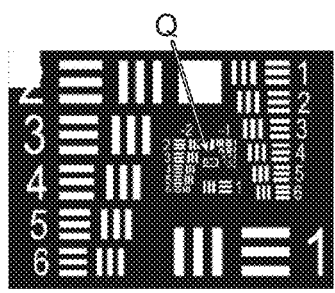
FIG. 13A is a top view of the 1951 USAF resolution test chart.
Figure 13B:
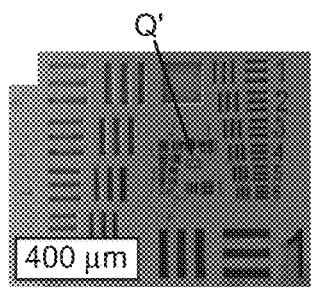
FIG. 13B is a top view of a three-dimensional object that includes a MicroSpray™ photoresist material onto which the test chart illustrated in FIG. 13A has been printed.
Figure 13C:
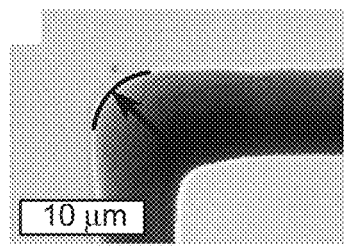
FIG. 13C is a top, detailed view of a small channel around a portion of the test chart that was printed on the three-dimensional object of FIG. 13B.

FIGS. 13A-13F are provided to demonstrate the quality of resolution that is possible using the systems, devices, and methods provided for in this disclosure. FIG. 13A illustrates the 1951 USAF resolution test chart, which is provided to illustrate a base resolution. FIG. 13B illustrates a glass substrate with a 5 micrometer thick layer of MicroSpray™ photoresist material applied to its surface having the 1951 USAF resolution test chart printed on it using the techniques described above. The result is a resolution of 5 micrometers, which is also discernible from the image of a rounded corner of a smallest channel from the material of FIG. 13B that is magnified in FIG. 13C.

Figure 13D:
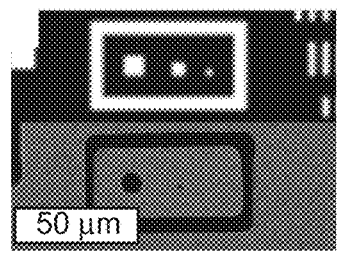
FIG. 13D is a top, schematic view providing a comparison of a subsection of the 1951 USAF resolution test chart of FIG. 13A with the same subsection of the test chart of FIG. 13B using 1, 4, and 16 pixels for exposure.

FIG. 13D provides for a comparison of the same subsection of the 1951 USAF resolution test chart for the image in FIGS. 13A and 13B at 1, 4, and 16 pixels being used for exposure. In the illustrated embodiments, the subsection is identified in each of FIGS. 13A and 13B as being subsections Q and Q', respectively. Notably, the image associated with subsection Q' appears rounded due to the focus limitations at the provided length-scale.

Figure 13E:
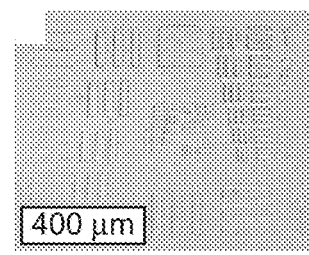
FIG. 13E is a top view of a three-dimensional object that includes poly(ethylene glycol)diacrylate (PEGda) photoresist material on a glass slide onto which the test chart illustrated in FIG. 13A has been printed.
Figure 13F:
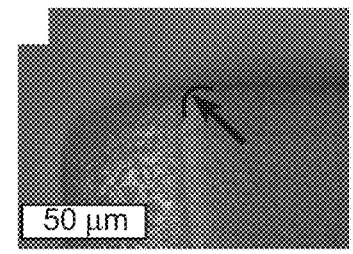
FIG. 13F is a scanning electron microscopy (SEM) image of a small feature of the test chart that was printed on the three-dimensional object of FIG. 13E.

FIG. 13E illustrates a glass substrate with a 10 micrometer thick layer of PEGda photoresist material applied to its surface having the 1951 USAF resolution test chart printed on it using the techniques described above. As shown, the performance of the material in FIG. 13E was not as good as the material in FIG. 13B, perhaps because of the thickness of the photoresist material and/or because of the nature of each resist, i.e., the MicroSpray™ photoresist material being positive and the PEGda photoresist being negative. FIG. 13F, which is an SEM magnified image of a rounded corner of a small feature from the material of FIG. 13B, further demonstrates that the quality in this second example was not as good as in the first example.

While the embodiments provided for herein primarily discuss printing a two-dimensional image onto a surface of a three-dimensional object, the disclosures provided for herein also provide for the ability to print a three-dimensional structure onto a surface of a three-dimensional object. In such instances, techniques known to those skilled in the art for depositing resin to produce three-dimensional structures can be incorporated into the system 10. By way of non-limiting example, a resin dispenser can be provided to deposit a layer to be cured onto the surface of the three-dimensional object. The layer can then be cured using the techniques provided for herein, after which a next layer can be deposited on the previous layer to provide the second layer of the three-dimensional structure, and the second layer can be subsequently cured using the techniques provided for herein. This process can continue to be carried out layer-by-layer until the three-dimensional structure has been printed on the surface of the three-dimensional object.

Alternatively, the disclosures provided for herein can also be applied to printing three-dimensional structures more generally, in which case that printing may not necessarily be performed on a three-dimensional object (although it could be). A person skilled in the art, in view of the present disclosures, would understand how to apply the present disclosures to three-dimensional printing. For example, rather than receiving information about an image and associating a pattern of polygons to it (or receiving an image that already has polygons associated with it in accordance with the present disclosures), or scanning an image and associating a pattern of polygons to it, a three-dimensional object can be substituted for the image. In a three-dimensional printing context, each polygon is a member of a set of polygons that represents a slice or layer of the three-dimensional object to be printed, and an entire three-dimensional object to be printed may be represented by a three-dimensional model (e.g., a .STL file) or by a series of slices and/or polygons that enable production of the three-dimensional object using the systems, devices, and methods provided for herein. The printing then occurs by moving the system through the series of polygons, both in the local object plane and in the object normal, such that each consecutive polygon is printed after the polygon at least partially located beneath the current polygon. When the system has six or seven degrees of freedom as provided for herein, larger free-form structures can be printed without any support structure that is necessary in known methods such as sterolithgography. In some embodiments for printing three-dimensional structures, a build window can be provided that is transparent to light used to cure the resin used in printing, and the resin can be captured between the build window and the surface of the object.

Figure 14A:
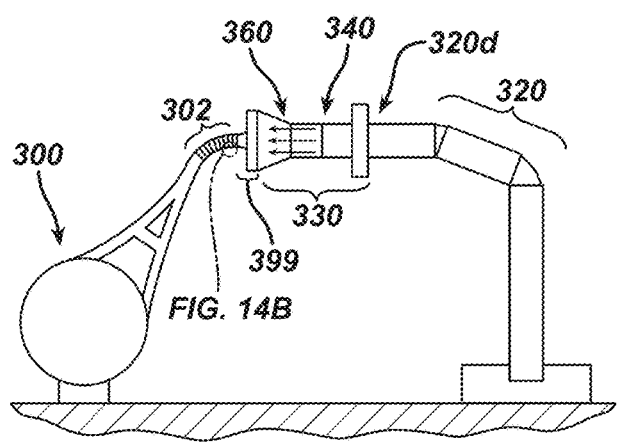
FIG. 14A is a side, schematic view of one exemplary embodiment of a system for printing a three-dimensional structure.
Figure 14B:
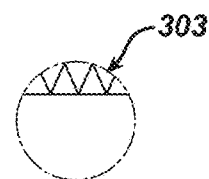
FIG. 14B is a detailed, schematic view of one layer of a three-dimensional structure that can be printed by the system of FIG. 14A.

One exemplary embodiment of a system for printing three-dimensional structures is illustrated in FIGS. 14A and 14B. As shown in FIG. 14A, the system includes a robotic manipulator 320 and an end effector 330 coupled to a distal end 320d thereof. The end effector 330 can include a spatial light modulator 340, which itself can include first and second light sources (or a single light source as described above), a controller, and a DMD (or other component that provides the same functionality of directing light to the location of printing), and an objective or lens 360, as well any other components described herein or otherwise known to those skilled in the art. Additionally, a dispenser or nozzle 399 for applying resin to be printed to form the three-dimensional structure can be provided distal of the end effector 330. Printing occurs on a surface, as shown an object substrate 300, and then the layers are built on top of each other to form the three-dimensional object 302. Notably, as the layers continue to be built on top of each other, it is possible to build an overhanging structure without support, even as a layer orientation changes across a curvature. As shown in FIG. 14B, each layer includes a plurality of polygons 303.

Although examples in the present disclosure include printing on a three-dimensional object that is a sphere, the use of a sphere as a three-dimensional object is by no means limiting as to the types of structures, shapes, and surfaces on which the present disclosures can be used. As described throughout the application, the present disclosure allows for printing on many differently shaped three-dimensional structures, including structures that are non-uniform, asymmetric, arbitrary, and/or curved such that the surface has multiple radii of curvature. This is particularly clear from the descriptions related to equations 1 and 2 above.

The systems, devices, and methods provided for herein can be used, or adapted for use, across a variety of applications. For example, circuits and antennas can be printed on complex structures having multiple radii of curvature. These structures include but are not limited to external and internal devices, such as body armor, helmets, and eye, heart, and bone implants, as well as on industrial equipment, in which printed circuits can serve as sensors disposed within mold tooling or on turbine blades. Likewise, printing can be performed on tissue, including cartilage, opening a range of applications for use in the medical space, including but not limited printing on skin for tattoos, printing on a retina, and/or drug delivery directly on tissue or an implant. More specifically, when using the present teachings for personal medicine, an implant or body part can be scanned and the resulting three-dimensional topography can be used to pattern an ink containing cells or drugs for that implant or body part. By way of example, osteoblasts within the PEGda hydrogel can be used to promote healing or acceptance of a hip implant because in addition to their biocompatibility, the three-dimensional scanning of topologies and machine vision used during surgery make this method suitable as a tool in real time. By way of further non-limiting example, an ink containing cells, growth factors, drugs, or any other biologically relevant material within and/or on the surface of the body can be produced in view of the present disclosures. Hydrogel inks can be polymerized using biocompatible light sensitizers according to a pre-defined pattern and positions in an image, and the image can be derived from scanning a body part or implant, even in real time. For purposes of printing tattoos, the method can include injecting ink under tissue and then causing a photoreaction to make the ink alternate between permanent and temporary.

Custom prosthetics can be manufactured using the systems, devices, and methods disclosed, as can large plastic parts more generally, for instance by coating a large structure in a tank of photoresin and then performing the printing techniques disclosed herein. The disclosures can also be combined with post-processing to use the photoresist features as a mask. Because post-processing involves either etching protected regions or depositing unprotected regions and then removing the photoresist, the disclosures provided for herein can be useful in such an application. Further, curved optical components can be printed on in view of the present teachings. For example, metallization of lenses can enable real-time sensing of fluence through a system, or wavefront correction can be performed on optical components by adding small amounts of material to the surface based on high performance three-dimensional scans. The scan can be used to continuously monitor the shape as it is formed if desired.

The present systems, devices, and methods can also be conducive to applying anti-fouling materials to objects. Molds having microfeatures that are resistant to wetting or bacterial growth can be printed onto curved surfaces as desired. In other instances, the disclosures can be applied to assembling parts by patterning wettable regions on a curved surface that is dipped into a path of parts, particles, or chiplets that adhere to the template locations. Such a process can be compatible with additional wire bonding processes. In other instances, post-processing that involves deposition of catalyst for growing nanomaterials on a curved surface. This can enable fabrication of large area nanostructures such as on turbine blades that control drag using patterned microstructures such as carbon nanotubes (CNT) grown on their surface, for instance by chemical vapor deposition heating and exposure to growth conditions. The present disclosures also enable masking the metal with a photoresist and then depositing catalyst via sputtering.

One skilled in the art will appreciate further features and advantages of the invention based on the above-described embodiments. Accordingly, the invention is not to be limited by what has been particularly shown and described, except as indicated by the appended claims. All publications and references cited herein are expressly incorporated herein by reference in their entirety.

What is claimed is:
1. A method of printing onto a surface of a three-dimensional object, comprising:
 conducting a three-dimensional scan of a surface of a three-dimensional object;

associating a pattern of polygons with the surface;
recording information about a relationship between the pattern of polygons and the scanned surface;
recording information about a relationship between a pattern of polygons associated with an image to be projected onto the surface;
scaling the pattern of polygons associated with the image to the pattern of polygons associated with the surface based on the recorded information to create a scaled pattern of polygons;
depositing a photosensitive material onto the surface of the three-dimensional object;
projecting one or more polygons of the scaled pattern of polygons onto the surface; and
curing the photosensitive material deposited on a portion of the surface onto which the one or more polygons of the scaled pattern of polygons are projected.

2. The method of claim 1, wherein:
recording information about a relationship between the pattern of polygons and the scanned surface includes recording information about locations of polygons of the pattern of polygons on the scanned surface,
recording information about a relationship between a pattern of polygons associated with an image to be projected onto the surface includes recording information about a region of the image located within each polygon of the pattern of polygons, and
scaling the pattern of polygons associated with the image to the pattern of polygons associated with the surface includes associating the information about the region of the image located within each polygon of the pattern of polygons with the respective polygons of the pattern of polygons on the scanned surface of the three-dimensional object.

3. The method of claim 2, wherein projecting one or more polygons of the scaled pattern of polygons onto the surface further comprises:
identifying a centroid of each one or more polygons of the scaled pattern of polygons to be projected onto the surface of the three-dimensional object; and
moving at least one of the three-dimensional object and a printing device that projects the one or more polygons of the scaled pattern of polygons onto the surface such that a the plane of the printing device that is approximately normal to a central axis of the objective is approximately normal to the centroid and a distance between the printing device and the surface of the three-dimensional object provides a focused image for the one or more polygons that are projected.

4. The method of claim 1, further comprising:
projecting one or more additional polygons of the scaled pattern of polygons onto the surface of the three-dimensional object; and
curing the photosensitive material deposited on another portion of the surface of the three-dimensional object onto which the one or more additional polygons of the scaled pattern of polygons are projected,
wherein additional polygons of the scaled pattern of polygons are progressively projected onto the surface and the photosensitive material deposited on each respective portion of the surface is cured to print the image onto the surface.

5. The method of claim 1, wherein light is used to project one or more polygons of the scaled pattern of polygons onto the surface, the method further comprising:
splitting a beam of light directed towards the surface of the three-dimensional object such that a portion of the beam of light is directed towards the surface and a portion of the beam is directed towards an alternate location;
reviewing an image associated with the portion of the beam of light that is directed towards the alternate location; and
adjusting a location of at least one of the three-dimensional object and a printing device that projects the one or more polygons of the scaled pattern of polygons onto the surface of the three-dimensional object based on a review of the image associated with the portion of the beam of light that is directed toward the alternate location.

6. The method of claim 5, further comprising:
receiving one or more images from one or more cameras directed towards the three-dimensional object,
wherein adjusting a location of at least one of the three-dimensional object and a printing device that projects the one or more polygons of the scaled pattern of polygons onto the surface of the three-dimensional object is also based on a review of the one or more images received from the one or more cameras directed towards the three-dimensional object.

7. The method of claim 1, wherein the polygons of each of the pattern of polygons associated with the surface, the pattern of polygons associated with the image, the scaled pattern of polygons, and the one or more polygons of the scaled pattern of polygons that are projected onto the surface are triangles.

8. The method of claim 1, wherein the surface of the three-dimensional object includes multiple curved surfaces, the curved surfaces having different radii of curvature.

9. The method of claim 1, wherein a ratio of polygons associated with the surface of the three-dimensional object to an area of the surface of the three-dimensional object is approximately equal to or greater than about 100 polygons per square millimeter.

10. The method of claim 1,
wherein depositing a photosensitive material onto the surface of the three-dimensional object further comprises controlling a location of a build window to define a top surface of a layer of the photosensitive material deposited onto the surface of the three-dimensional object, and
wherein curing the photosensitive material deposited on a portion of the surface onto which the one or more polygons of the scaled pattern of polygons are projected further comprises passing light through the build window to cure the photosensitive material.

11. The method of claim 1, wherein the step of depositing a photosensitive material onto the surface of the three-dimensional object is performed across six degrees of freedom.

12. The method of claim 11, wherein the steps of projecting one or more polygons of the scaled pattern of polygons onto the surface and curing the photosensitive material deposited on a portion of the surface onto which the one or more polygons of the scaled pattern of polygons are projected are both performed across six degrees of freedom.

13. The method of claim 1, wherein the steps of depositing a photosensitive material onto the surface of the three-dimensional object, projecting one or more polygons of the scaled pattern of polygons onto the surface, and curing the photosensitive material deposited on a portion of the surface onto which the one or more polygons of the scaled pattern of polygons are projected result in the formation of one layer of a printed three-dimensional object, the method further comprising:
  depositing a photosensitive material onto at least a portion of the one layer of the printed three-dimensional object;
  projecting one or more polygons of the scaled pattern of polygons onto the at least a portion of the one layer of the printed three-dimensional object; and
  curing the photosensitive material deposited onto at least a portion of the one layer of the printed three-dimensional object to form a second layer of the printed three-dimensional object.

14. The method of claim 13, further comprising performing the depositing, projecting, and curing steps of claim 13 to form additional layers of the printed three-dimensional object.

15. A method of printing onto a surface, comprising:
  providing a surface onto which printing is to occur;
  associating a pattern of polygons with the surface;
  recording information about a relationship between the pattern of polygons and the surface;
  recording information about a relationship between a pattern of polygons associated with an image to be projected onto the surface;
  scaling the pattern of polygons associated with the image to the pattern of polygons associated with the surface based on the recorded information to create a scaled pattern of polygons;
  depositing a photosensitive material onto the surface;
  projecting one or more polygons of the scaled pattern of polygons onto the surface; and
  curing the photosensitive material deposited on a portion of the surface onto which the one or more polygons of the scaled pattern of polygons are projected.

16. The method of claim 15, wherein:
  recording information about a relationship between the pattern of polygons and the surface includes recording information about locations of polygons of the pattern of polygons on the surface,
  recording information about a relationship between a pattern of polygons associated with an image to be projected onto the surface includes recording information about a region of the image located within each polygon of the pattern of polygons, and
  scaling the pattern of polygons associated with the image to the pattern of polygons associated with the surface includes associating the information about the region of the image located within each polygon of the pattern of polygons with the respective polygons of the pattern of polygons on the surface.

17. The method of claim 16, wherein projecting one or more polygons of the scaled pattern of polygons onto the surface further comprises:
  identifying a centroid of each one or more polygons of the scaled pattern of polygons to be projected onto the surface; and
  moving at least one of the surface and a printing device that projects the one or more polygons of the scaled pattern of polygons onto the surface such that the a plane of the printing device that is approximately normal to a central axis of the objective is approximately normal to the centroid and a distance between the printing device and the surface provides a focused image for the one or more polygons that are projected.

18. The method of claim 15, further comprising:
  projecting one or more additional polygons of the scaled pattern of polygons onto the surface; and
  curing the photosensitive material deposited on another portion of the surface onto which the one or more additional polygons of the scaled pattern of polygons are projected,
  wherein additional polygons of the scaled pattern of polygons are progressively projected onto the surface and the photosensitive material deposited on each respective portion of the surface is cured to print the image onto the surface.

19. The method of claim 15, wherein light is used to project one or more polygons of the scaled pattern of polygons onto the surface, the method further comprising:
  splitting a beam of light directed towards the surface such that a portion of the beam of light is directed towards the surface and a portion of the beam is directed towards an alternate location;
  reviewing an image associated with the portion of the beam of light that is directed towards the alternate location; and
  adjusting a location of at least one of the surface and a printing device that projects the one or more polygons of the scaled pattern of polygons onto the surface based on a review of the image associated with the portion of the beam of light that is directed toward the alternate location.

20. The method of claim 19, further comprising:
  receiving one or more images from one or more cameras directed towards the surface,
  wherein adjusting a location of at least one of the surface and a printing device that projects the one or more polygons of the scaled pattern of polygons onto the surface is also based on a review of the one or more images received from the one or more cameras directed towards the surface.

21. The method of claim 15, wherein a ratio of polygons associated with the surface to an area of the surface is approximately equal to or greater than about 100 polygons per square millimeter.

22. The method of claim 15,
  wherein depositing a photosensitive material onto the surface further comprises controlling a location of a build window to define a top surface of a layer of the photosensitive material deposited onto the surface, and
  wherein curing the photosensitive material deposited on a portion of the surface onto which the one or more polygons of the scaled pattern of polygons are projected further comprises passing light through the build window to cure the photosensitive material.

23. A method of printing onto a surface of a three-dimensional object, comprising:
  projecting an image to be printed onto a surface of a three-dimensional object from an objective, the objective having an image plane that is approximately normal to a central axis extending centrally through an opening of the objective through which the image is projected;
  depositing a photosensitive material onto the surface of the three-dimensional object;
  curing the photosensitive material deposited on a portion of the surface of the three-dimensional object to print a portion of the projected image onto the surface,
  wherein at least one of depositing a photosensitive material onto the surface of the three-dimensional object and curing the photosensitive material deposited on a portion of the surface of the three-dimensional object to print a portion of the projected image onto the surface occurs while an orientation of the image plane changes across six degrees of freedom with respect to the surface of the three-dimensional object.

24. The method of claim 23, further comprising coating the surface with a material that sets the cured printed image on the surface.

25. The method of claim 23, wherein the surface of the three-dimensional object includes multiple curved surfaces, the curved surfaces having different radii of curvature.

26. The method of claim 23,
wherein depositing a photosensitive material onto the surface of the three-dimensional object further comprises controlling a location of a build window to define a top surface of a layer of the photosensitive material deposited onto the surface of the three-dimensional object, and
wherein curing the photosensitive material deposited on a portion of the surface of the three-dimensional object further comprises passing light through the build window to cure the photosensitive material.

27. The method of claim 23, wherein the actions of depositing a photosensitive material onto the surface of the three-dimensional object and curing the photosensitive material deposited on a portion of the surface of the three-dimensional object result in the formation of one layer of a printed three-dimensional object, the method further comprising:
depositing a photosensitive material onto at least a portion of the one layer of the printed three-dimensional object; and
curing the photosensitive material deposited onto at least a portion of the one layer of the printed three-dimensional object to form a second layer of the printed three-dimensional object,
wherein at least one of depositing a photosensitive material onto at least a portion of the one layer of the printed three-dimensional object and curing the photosensitive material deposited onto at least a portion of the one layer of the printed three-dimensional object to form a second layer of the printed three-dimensional object occurs while an orientation of the image plane changes across six degrees of freedom with respect to the one layer of the printed three-dimensional object.

28. The method of claim 27, further comprising performing the depositing and curing actions of claim 27 to form additional layers of the printed three-dimensional object.

29. The method of claim 23, wherein the image projected onto the surface of the three-dimensional object is associated with a pattern of polygons, and the method further comprises:
determining a scaled pattern of polygons based on the pattern of polygons associated with the image and a pattern of polygons associated with the surface of the three-dimensional object; and
projecting one or more polygons of the scaled pattern of polygons onto the surface of the three-dimensional object,
wherein the photosensitive material is cured based on at least one polygon of the one or more polygons of the scaled pattern of polygons projected onto the surface of the three-dimensional object.

30. The method of claim 29, wherein light is used to project one or more polygons of the scaled pattern of polygons onto the surface, the method further comprising:
splitting a beam of light directed towards the surface of the three-dimensional object such that a portion of the beam of light is directed towards the surface and a portion of the beam is directed towards an alternate location;
reviewing an image associated with the portion of the beam of light that is directed towards the alternate location; and
adjusting a location of at least one of the three-dimensional object and the objective based on a review of the image associated with the portion of the beam of light that is directed toward the alternate location.

* * * * *